I (12) United States Patent
Seo et al.

(10) Patent No.: US 12,412,606 B2
(45) Date of Patent: Sep. 9, 2025

(54) RECEIVERS AND SEMICONDUCTOR MEMORY DEVICES INCLUDING THE SAME

(71) Applicant: Samsung Electronics Co., Ltd., Suwon-si (KR)

(72) Inventors: Dongin Seo, Suwon-si (KR); Jaewoong Kim, Suwon-si (KR); Changhyun Bae, Suwon-si (KR); Hyeseung Yu, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 89 days.

(21) Appl. No.: 18/473,837

(22) Filed: Sep. 25, 2023

(65) Prior Publication Data

US 2024/0347085 A1    Oct. 17, 2024

(30) Foreign Application Priority Data

Apr. 11, 2023    (KR) ................. 10-2023-0047206

(51) Int. Cl.
*G11C 7/20* (2006.01)
*G11C 7/10* (2006.01)
*G11C 7/22* (2006.01)

(52) U.S. Cl.
CPC ............. *G11C 7/20* (2013.01); *G11C 7/106* (2013.01); *G11C 7/1063* (2013.01); *G11C 7/222* (2013.01)

(58) Field of Classification Search
CPC ......... G11C 7/20; G11C 7/106; G11C 7/1063; G11C 7/222; G11C 7/1006; G11C 7/1084; G11C 7/1093; G11C 11/4072; G11C 11/4076; G11C 11/4096; G11C 11/4063; G11C 7/1018; G11C 7/1048; H04L 25/03267
USPC ......................................................... 365/191
See application file for complete search history.

(56) References Cited

U.S. PATENT DOCUMENTS

| | | |
|---|---|---|
| 10,311,940 B2 | 6/2019 | DeSimone et al. |
| 10,490,241 B2 | 11/2019 | Penney et al. |
| 10,825,494 B2 | 11/2020 | Penney et al. |
| 11,145,353 B1 | 10/2021 | Waldrop et al. |
| 11,336,491 B2 | 5/2022 | Yi et al. |
| 11,417,374 B1 | 8/2022 | Waldrop et al. |

(Continued)

FOREIGN PATENT DOCUMENTS

DE    102009034851 A1 *    6/2010    ........... G09G 3/3648

*Primary Examiner* — Fernando Hidalgo
(74) *Attorney, Agent, or Firm* — Harness, Dickey & Pierce, P.L.C.

(57) ABSTRACT

A receiver includes a buffer configured to generate an internal data signal by comparing a received data signal with a reference voltage, a decision feedback equalizer configured to generate a sampled signal based on a present value of the internal data signal and on a feedback signal, and configured to provide one of the sampled signal or a first logic level as the feedback signal based on a reset control signal, the sampled signal corresponding to a previous value of the internal data signal, a deserializer configured to generate an output data by deserializing the sampled signal, and a reset control circuit configured to generate the reset control signal based on operating information associated with a write operation of the data signal and configured to provide the reset control signal to the decision feedback equalizer.

20 Claims, 26 Drawing Sheets

(56) References Cited

U.S. PATENT DOCUMENTS

2014/0003564 A1  1/2014  Kammaje
2018/0183630 A1  6/2018  Kim et al.
2022/0302943 A1  9/2022  Bandi et al.

* cited by examiner

ND SEMICONDUCTOR
RECEIVERS AND SEMICONDUCTOR MEMORY DEVICES INCLUDING THE SAME

CROSS-REFERENCE TO RELATED APPLICATION

This application claims priority under 35 USC § 119 to Korean Patent Application No. 10-2023-0047206, filed on Apr. 11, 2023 in the Korean Intellectual Property Office (KIPO), the disclosure of which is incorporated by reference herein in its entirety.

BACKGROUND

Various example embodiments relate generally to semiconductor integrated circuits, and more particularly to receivers capable of securing timing margins and semiconductor memory devices including the same.

Semiconductor memory devices can generally be divided into two categories depending upon whether or not they retain stored data when disconnected from a power supply. These categories include volatile memory devices, which may lose stored data when disconnected from power, and nonvolatile memory devices, which may retain stored data when disconnected from power. Volatile memory devices may perform read and/or write operations at a high speed, while contents stored therein may be lost at power-off. Nonvolatile memory devices may retain contents stored therein even at power-off, which indicates they may be used to store data that must be retained regardless of whether they are powered.

Recently, as the performance of the semiconductor memory device is improved, a high communication speed (or interface speed) is required or expected between a memory controller and the semiconductor memory device. The high communication speed may influence performance of a receiver in the semiconductor memory device.

SUMMARY

Some example embodiments of inventive concepts may provide a receiver capable of securing or helping to secure timing margin even when a communication speed increases.

Alternatively or additionally, some example embodiments of inventive concepts provide a semiconductor device including a receiver capable of securing or helping to secure timing margin even when a communication speed increases.

According to some example embodiments, a receiver includes a buffer configured to generate an internal data signal by comparing a received data signal with a reference voltage, a decision feedback equalizer configured to generate a sampled signal based on a present value of the internal data signal and on a feedback signal, and configured to provide the sampled signal or a first logic level as the feedback signal based on a reset control signal, the sampled signal corresponding to a previous value of the internal data signal, a deserializer configured to generate an output data by deserializing the sampled signal, and a reset control circuit configured to generate the reset control signal based on operating information associated with a write operation of the data signal and configured to provide the reset control signal to the decision feedback equalizer.

Alternatively or additionally according to some example embodiments, a semiconductor memory device includes a receiver connected to a memory controller through a channel, the receiver configured to generate an output data based on a data signal received from the channel, and a control logic circuit configured to generate operating information associated with controlling the receiver based on a command received from the memory controller. The receiver comprises a buffer configured to generate an internal data signal by comparing the data signal with a reference voltage, a decision feedback equalizer configured to generate a sampled signal based on a present value of the internal data signal and a feedback signal, and configured to provide the sampled signal or a first logic level as the feedback signal based on a reset control signal, the sampled signal corresponding to a previous value of the internal data signal, a deserializer configured to generate the output data by deserializing the sampled signal, and a reset control circuit configured to generate the reset control signal based on the operating information associated with a write operation of the data signal and configured to provide the reset control signal to the decision feedback equalizer.

Alternatively or additionally according to some example embodiments, a receiver includes a buffer configured to generate an internal data signal by comparing a received data signal with a reference voltage, a decision feedback equalizer configured to generate a sampled signal based on a present value of the internal data signal and on a feedback signal, and configured to provide the sampled signal or a first logic level as the feedback signal based on a reset control signal, the sampled signal corresponding to a previous value of the internal data signal, a deserializer configured to generate an output data by deserializing the sampled signal, and a reset control circuit configured to generate the reset control signal based on operation information associated with a write operation of the data signal and configured to provide the reset control signal to the decision feedback equalizer. The decision feedback equalizer includes a summer configured to generate a compensated data signal by summing the internal data signal and the feedback signal, a slicer configured to output the sampled signal by sampling the compensated data signal based on a data strobe signal, and a selection circuit configured to operate based on the reset control signal to update the feedback signal with the sampled signal in a first operation mode in which the write operation is performed on the data signal and configured to reset the feedback signal with the first logic level in a second operation mode in which the write operation is not performed on the data signal.

Accordingly, the decision feedback equalizer of the receiver according to various example embodiments, is more stably reset and/or is more likely to secure an operating timing margin of the deserializer that generates an output data by deserializing bits of the sampled data, by adaptively resetting the feedback signal with the first logic level in the second operation mode in which the write operation is not performed on the data signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF SOME EXAMPLE EMBODIMENTS

Figure 1:
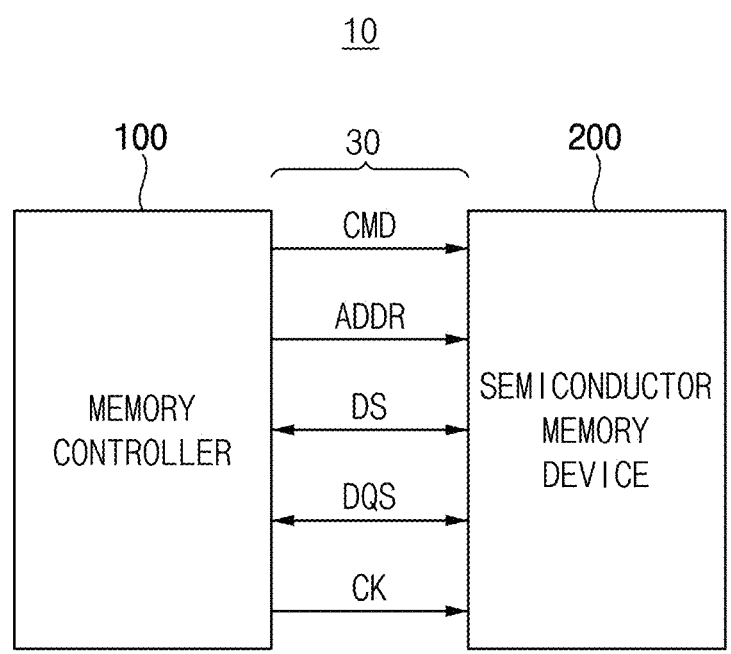
FIG. 1 is a block diagram illustrating a memory system according to various example embodiments.

Various example embodiments will be described more fully with reference to the accompanying drawings, in which embodiments are shown. Inventive concepts may, however, be embodied in many different forms and should not be construed as limited to the embodiments set forth herein. Like reference numerals refer to like elements throughout this application.

FIG. 1 is a block diagram illustrating a memory system according to various example embodiments.

Referring to FIG. 1, a memory system 10 may include a memory controller 100 and a semiconductor memory device 200. The memory system 10 may further include a plurality of signal lines 30 that electrically connect the memory controller 100 with the semiconductor memory device 200.

The semiconductor memory device 200 may be controlled by the memory controller 100. For example, based on requests from a host (not illustrated), the memory controller 100 may store (e.g., write and/or program) data into the semiconductor memory device 200, or may retrieve (e.g., read and/or sense) data from the semiconductor memory device 200.

The plurality of signal lines 30 may include one or more of command lines, address lines and data input/output (I/O) lines. The memory controller 100 may transmit a command CMD and an address ADDR to the semiconductor memory device 200 through the command lines and the address lines, and may exchange a data signal DS with the semiconductor memory device 200 via the data I/O lines.

Although not illustrated, the plurality of signal lines 30 may further include a data strobe signal line that transferring a data strobe signal DQS and a clock line transferring a clock signal CK.

In some example embodiments, at least a part or all of the signal lines 30 may be referred to as a channel. The term "channel" as used herein may represent signal lines that include the data I/O lines for transmitting the data signal DS. However, example embodiments are not limited thereto, and the channel may further include the command lines for transmitting the command CMD and/or the address lines for transmitting the address ADDR. In some example embodiments, the channel may be a wired channel; however, example embodiments are not limited thereto.

Figure 2:
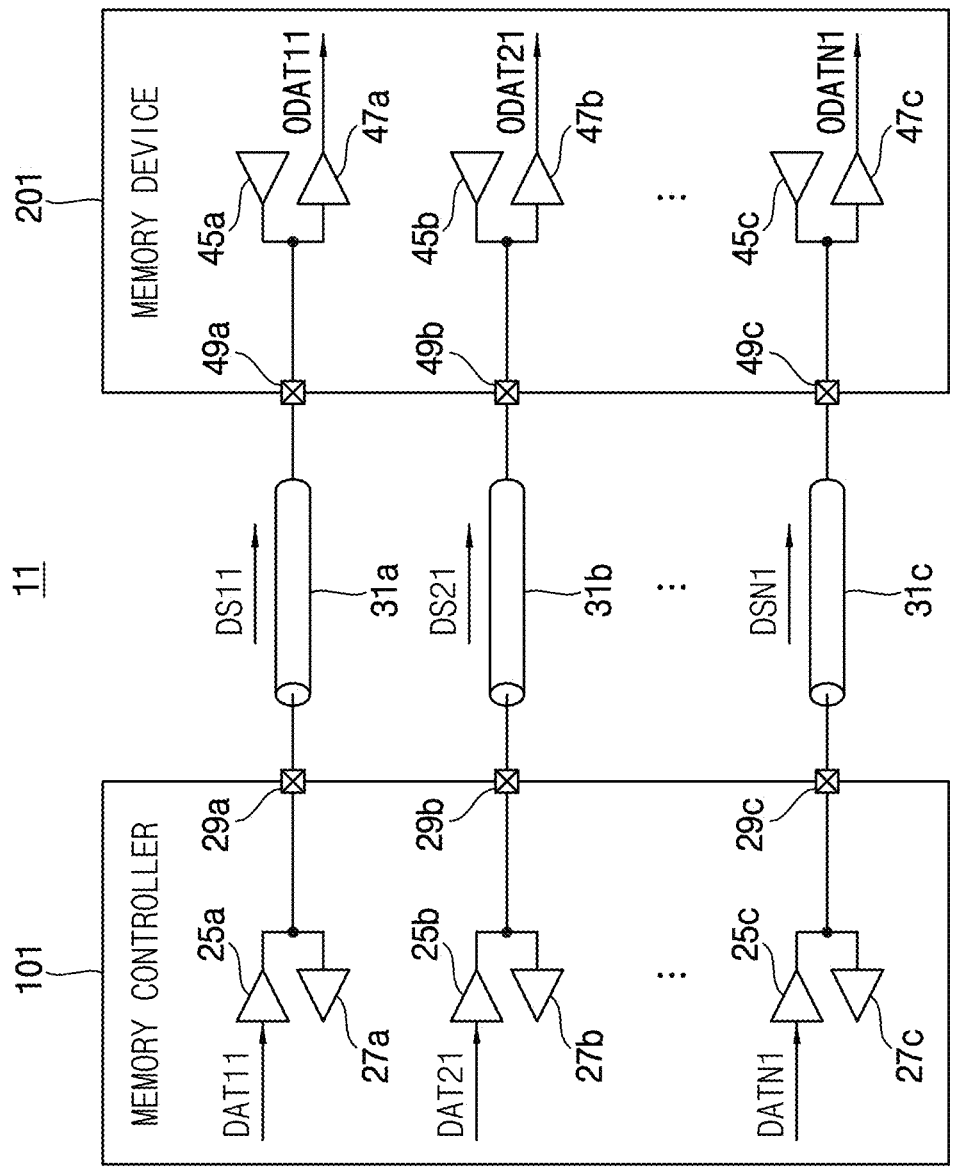
FIGS. 2 and 3 are block diagrams illustrating an example of a memory system of FIG. 1.
Figure 3:
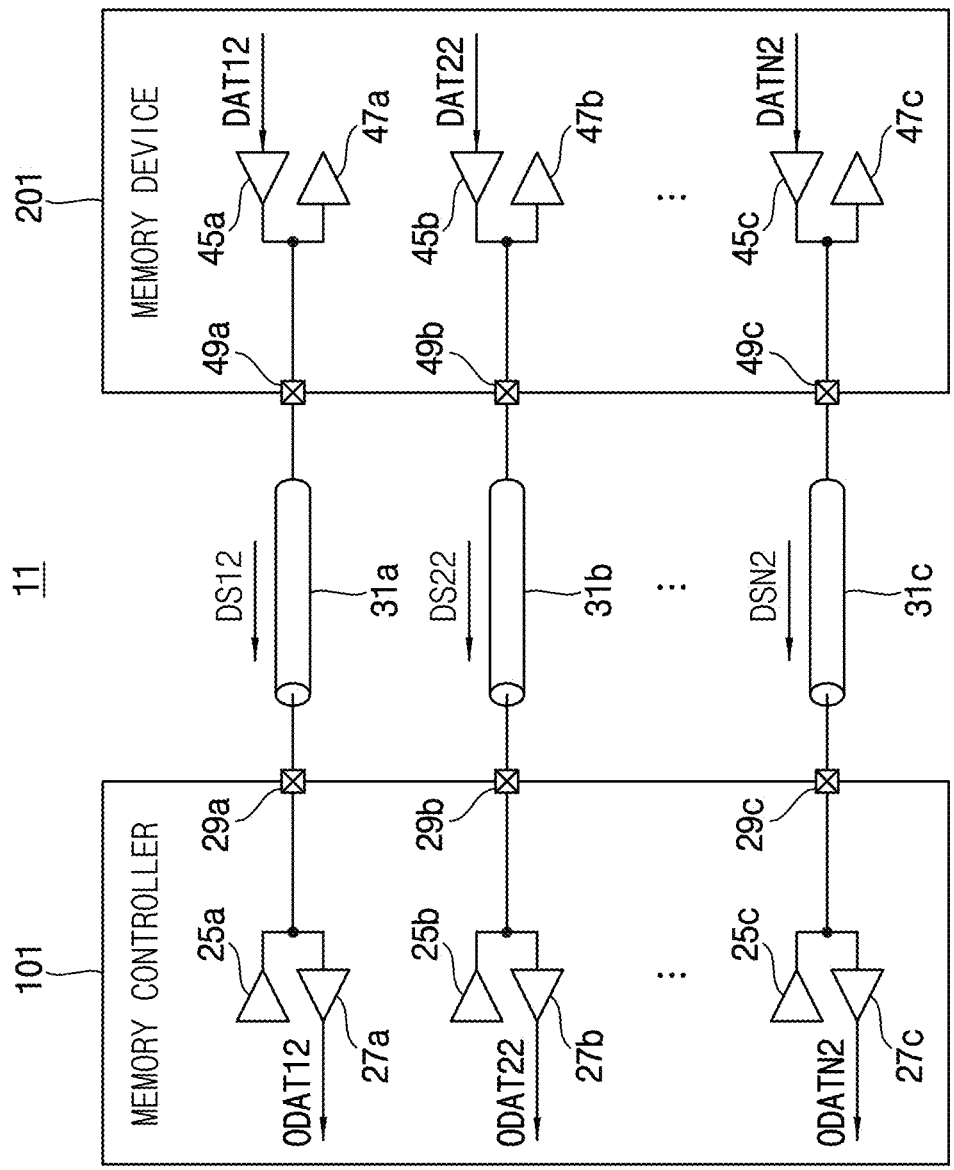

FIGS. 2 and 3 are block diagrams illustrating an example of a memory system of FIG. 1.

Referring to FIGS. 2 and 3, a memory system 11 includes a memory controller 101, a semiconductor memory device 201 and a plurality of channels 31a, 31b and 31c.

The memory controller 101 may include a plurality of transmitters 25a, 25b and 25c, a plurality of receivers 27a, 27b, and 27c, and a plurality of data I/O pads 29a, 29b and 29c. The semiconductor memory device 201 may include a plurality of transmitters 45a, 45b, and 45c, a plurality of receivers 47a, 47b and 47c, and a plurality of data I/O pads 49a, 49b, and 49c.

Each of the plurality of transmitters 25a, 25b, 25c, 45a, 45b, and 45c may generate a multi-level signal, and may perform the method of generating multi-level signal. Each of the plurality of receivers 27a, 27b, 27c, 47a, 47b, and 47c may receive the multi-level signal. The plurality of transmitters 25a, 25b, 25c, 45a, 45b, and 45c and the plurality of receivers 27a, 27b, 27c, 47a, 47b and 47c may transmit and/or receive the multi-level signal through the plurality of channels 31a, 31b and 31c.

Each of the plurality of data I/O pads 29a, 29b, 29c, 49a, 49b, and 49c may be connected to a respective one of the plurality of transmitters 25a, 25b, 25c, 45a, 45b and 45c and a respective one of the plurality of receivers 27a, 27b, 27c, 47a, 47b, and 47c.

The plurality of channels 31a, 31b and 31c may connect the memory controller 201 with or to the semiconductor memory device 201.

Each of the plurality of channels 31a, 31b, and 31c may be connected to a respective one of the plurality of transmitters 25a, 25b, and 25c and a respective one of the plurality of receivers 27a, 27b and 27c through a respective one of the plurality of data I/O pins or data I/O pads 29a, 29b, and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pins or data I/O pads 49a, 49b and 49c. The data signal may be transmitted through each of the plurality of channels 31a, 31b, and 31c, e.g., in parallel.

FIG. 2 illustrates an operation of transferring data from the memory controller 101 to the semiconductor memory device 201. For example, the transmitter 25a may generate an output data signal DS11 based on input data DAT11, the output data signal DS11 may be transmitted from the memory controller 21 to the memory device 41 through the channel 31a, and the receiver 47a may receive the output data signal DS11 to obtain data ODAT11 corresponding to the input data DAT11.

Similarly, the transmitter 25b may generate an output data signal DS21 based on input data DAT21, the output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1 based on input data DATN1, the output data signal DSN1 may be transmitted to the semiconductor memory device 201 through the channel 31c, and the receiver 47c may receive the output data signal DSN1 to obtain data ODATN1 corresponding to the input data DATN1. For example, the input data DAT11, DAT21 and DATN1 may be write data to be written into the semiconductor memory device 201.

FIG. 3 illustrates an operation of transferring data from the semiconductor memory device 201 to the memory controller 101. For example, the transmitter 45a may generate an output data signal DS12 based on input data DAT12, the output data signal DS12 may be transmitted from the memory device 41 to the memory controller 21 through the channel 31a, and the receiver 27a may receive the output data signal DS12 to obtain data ODAT12 corresponding to the input data DAT12.

Similarly, the transmitter 45b may generate an output data signal DS22 based on input data DAT22, the output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2 based on input data DATN2, the output data signal DSN2 may be transmitted to the memory controller 101 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 201.

In some example embodiments, the plurality of transmitters 25a, 25b, and 25c, along with the plurality of receivers 27a, 27b, and 27c, may be referred to as a plurality of first transceivers. Alternatively or additionally in some example embodiments, the plurality of transmitters 45a, 45b, and 45c, along with the plurality of receivers 49a, 49b, and 49c, may be referred to as a plurality of second transceivers. Example embodiments are not limited thereto.

Figure 4:
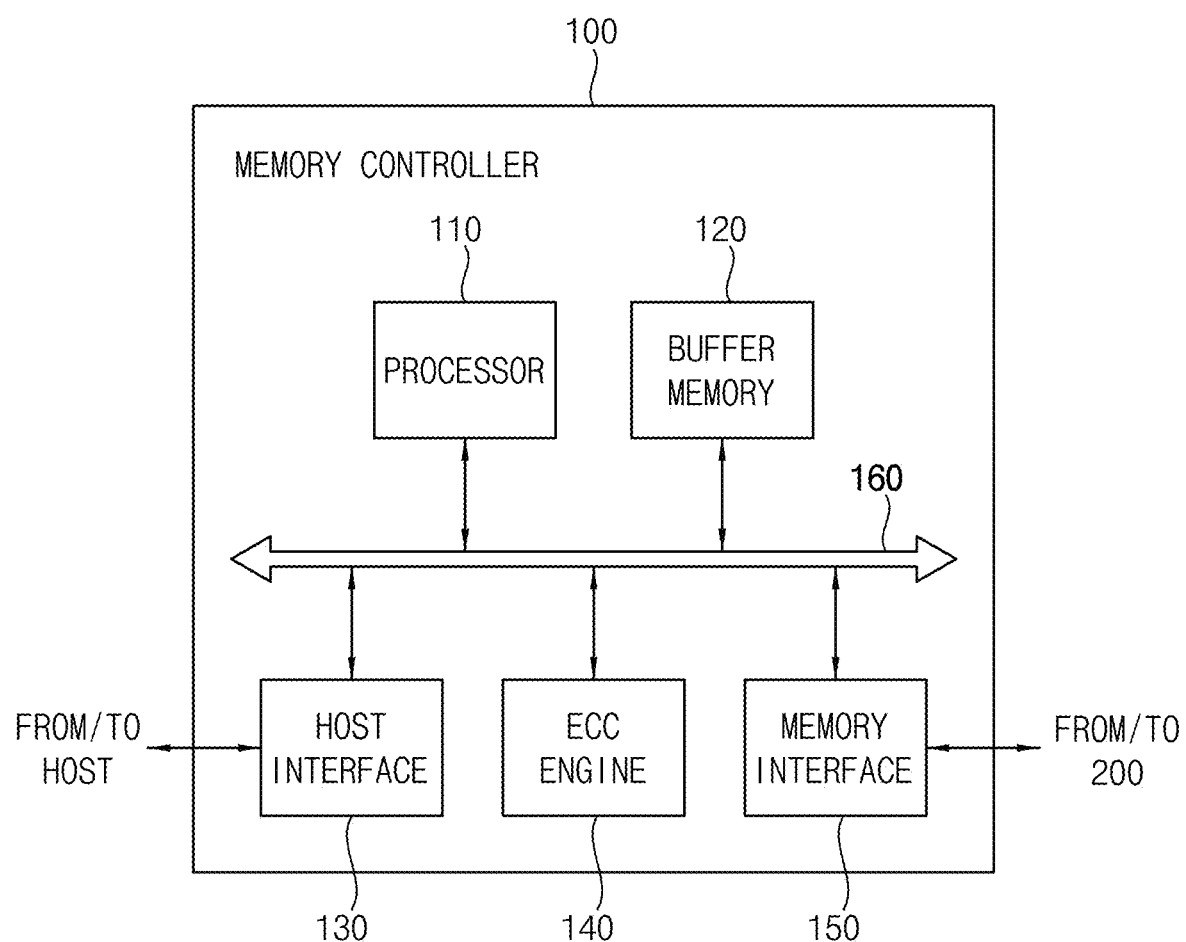
FIG. 4 is a block diagram illustrating an example of a memory controller included in a memory system according to various example embodiments.

FIG. 4 is a block diagram illustrating an example of a memory controller included in a memory system according to various example embodiments.

Referring to FIG. 4, a memory controller 100 may include at least one processor 110, a buffer memory 120, a host interface 130, an error correction code (ECC) engine 140 and a memory interface 150.

The processor 110 may control one or more operations of the memory controller 100 in response to a command and/or request data received from an external host (not illustrated) via the host interface 130. For example, the processor 110 may control respective components by employing firmware for operating a semiconductor memory device (e.g., the semiconductor memory device 200 in FIG. 1).

The buffer memory 120 may store instructions and/or data executed and processed by the processor 110. For example, the buffer memory 120 may be implemented with a volatile memory device such as one or more of a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100.

The ECC engine 140 for error correction may perform coded modulation using one or more of a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the semiconductor memory device 200. The memory interface 150 may transmit a command and an address to the semiconductor memory device 200, and may transmit data to the semiconductor memory device 200 or receive data read from the semiconductor memory device 200. Although not illustrated in FIG. 4, a transceiver or a transmitter (e.g., the transmitter 25a in FIG. 2) that generates the data signal according to various example embodiments and a receiver (e.g., the receiver 27a in FIG. 2) that receives the data signal may be included in the memory interface 150.

Figure 5:
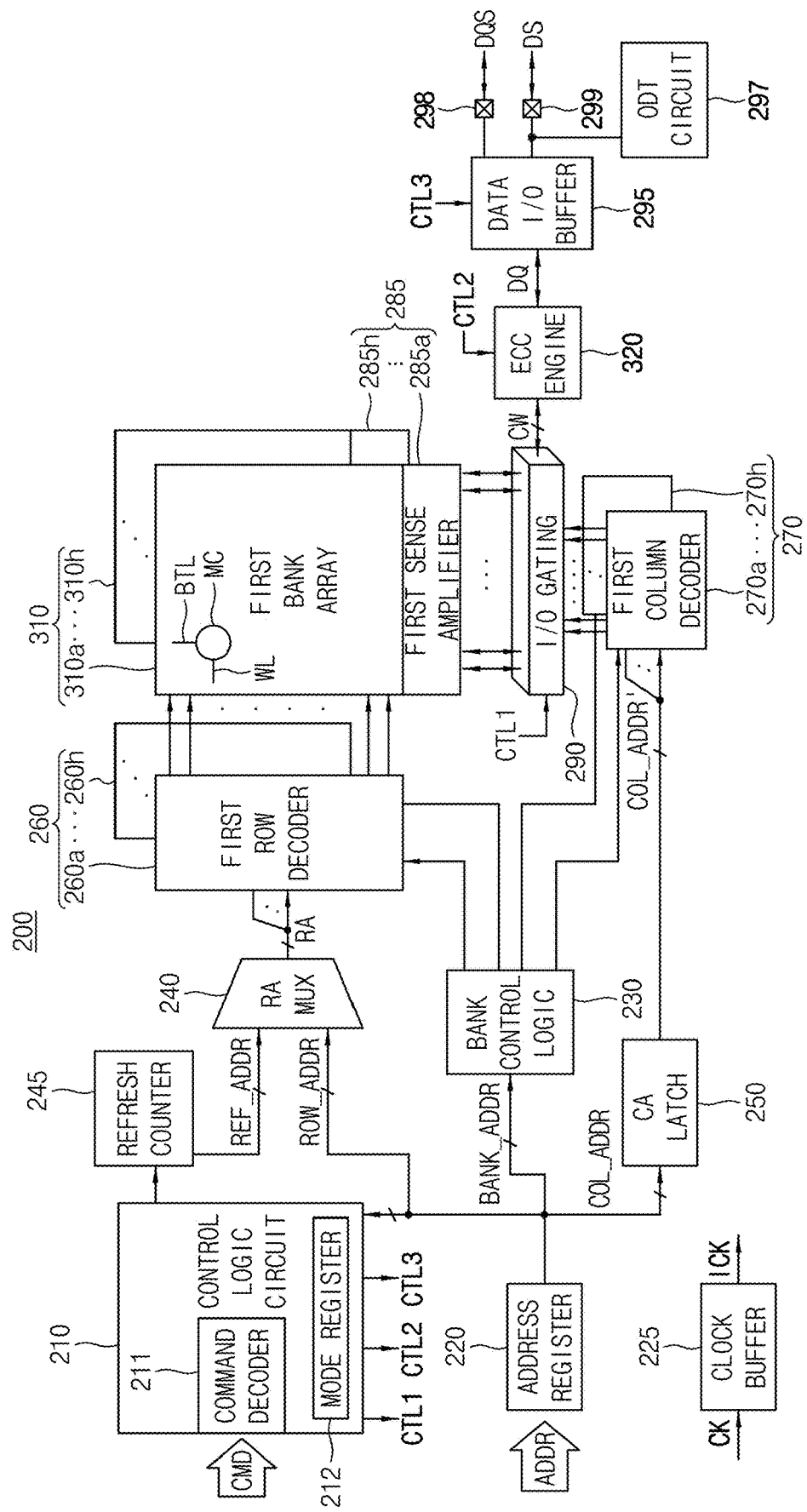
FIG. 5 is a block diagram illustrating an example of the semiconductor memory device included in the memory system of FIG. 1 according to various example embodiments.

FIG. 5 is a block diagram illustrating an example of the semiconductor memory device included in the memory system of FIG. 1 according to various example embodiments.

Referring to FIG. 5, the semiconductor memory device 200 may include a control logic circuit 210, an address register 220, a clock buffer 225, a bank control logic 230, a refresh counter 245, a row address multiplexer 240, a column address latch 250, a row decoder 260, a column decoder 270, a memory cell array 310, a sense amplifier unit 285, an I/O gating circuit 290, an error correction code (ECC) engine 320, an on-die termination (ODT) circuit 297 and a data I/O buffer 295.

For example, the semiconductor memory device 200 may be or may include, or be included in, a volatile memory device and may include a dynamic random access memory (DRAM) device.

The memory cell array 310 may include a number of bank arrays, such as first through eighth bank arrays 310a~380h.

The row decoder 260 may include first through eighth row decoders 260a~260h respectively coupled to the first through eighth bank arrays 310a~380h, the column decoder 270 may include first through eighth column decoders 270a~270h respectively coupled to the first through eighth bank arrays 310a~380h, and the sense amplifier unit 285 may include first through eighth sense amplifiers 285a~285h respectively coupled to the first through eighth bank arrays 310a~380h.

The first through eighth bank arrays 310a~380h, the first through eighth row decoders 260a~260h, the first through eighth column decoders 270a~270h and first through eighth sense amplifiers 285a~285h may form or may correspond to first through eighth banks. Each of the first through eighth bank arrays 310a~380h may include a plurality of memory cells MC formed at intersections of a plurality of word-lines WL and a plurality of bit-line BTL.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The clock buffer 225 may receive the clock signal CK, may generate an internal clock signal ICK by buffering the clock signal CK, and may provide the internal clock signal ICK to circuit components processing the command CMD and the address ADDR.

The bank control logic 230 may generates bank control signals in response to the bank address BANK_ADDR. One of the first through eighth row decoders 260a~260h corresponding to the bank address BANK_ADDR is activated in response to the bank control signals, and one of the first through eighth column decoders 270a~270h corresponding to the bank address BANK_ADDR is activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth row decoders 260a~260h.

The refresh counter 245 may sequentially increase or decrease the refresh row address REF_ADDR under control of the control logic circuit 210.

The activated one of the first through eighth row decoders 260a~260h, may decode the row address RA that is output from the row address multiplexer 240 by using the bank control logic 230 to decode the row address RA, and may activate a word-line corresponding to the row address RA. For example, the activated row decoder may apply a word-line driving voltage to the word-line corresponding to the row address. The word-line driving voltage may be a voltage greater than a threshold voltage of a respective access transistor associated with the memory cell.

The column address latch 250 may receive the column address COL_ADDR from the address register 220, and may temporarily store the received column address COL_ADDR. In some example embodiments, in a burst mode, the column address latch 250 may generate column addresses COL_ADDR' that increment from the received column address COL_ADDR. The column address latch 250 applies the temporarily stored or generated column address COL_ADDR' to the first through eighth column decoders 270a~270h.

The activated one of the first through eighth column decoders 270a~270h may activate a sense amplifier corresponding to the bank address BANK_ADDR and the column address COL_ADDR through the I/O gating circuit 290.

The I/O gating circuit 290 may include a circuitry for gating input/output data, and further includes input data mask logic, read data latches for storing data that is output from the first through eighth bank arrays 310a~380h, and write drivers for writing data to the first through eighth bank arrays 310a~380h.

The codeword CW read from one bank array of the first through eighth bank arrays 310a~380h may be sensed by a sense amplifier coupled to the one bank array from which the data is to be read, and may be stored in the read data latches. The codeword CW stored in the read data latches may be provided to the memory controller 100 via the data I/O buffer 295 after ECC decoding is performed on the codeword CW by the ECC engine 320.

A data output, or data DQ to be written in one bank array of the first through eighth bank arrays 310a~380h may be provided to the ECC engine 320 from the data I/O buffer 295, the ECC engine 320 may perform an ECC encoding on the data DQ to generate parity bits, the ECC engine 320 may provide the data DQ and the parity bits to the I/O gating circuit 290 and the I/O gating circuit 290 may write the data DQ and the parity bits in a sub-page in one bank array through the write drivers.

The data I/O buffer 295 may convert the data signal DS received from the memory controller 100 to the data DQ and may provide the data DQ to the ECC engine 390 in a write operation of the semiconductor memory device 200a. The data I/O buffer 295 may convert the data DQ to the data signal DS and may provide the data signal DS to the memory controller in a read operation of the semiconductor memory device 200a.

The data I/O buffer 295 may transmit/receive the data signal DS via a data I/O pad 299 and may transmit/receive the data strobe signal DQS via a strobe pad 298.

The data I/O buffer 295 may include a transceiver or a transmitter and a receiver. The receiver may include a decision feedback and a deserializer. The decision feedback equalizer may generate a sampled signal based on a current value or a present value of an internal data signal based on the data signal, and on a feedback signal, and may provide the sampled signal or a first logic level as the feedback signal based on a reset control signal. The sampled signal may correspond to a previous value of the internal data signal. The deserializer may generate an output data by deserializing the sampled signal. The decision feedback equalizer may maintain a timing margin of the deserializer without reducing the timing margin of the deserializer by updating the feedback signal with the sampled signal in a first operation mode in which the write operation is performed on the data signal and by resetting the feedback signal with the first logic level in a second operation mode in which the write operation is not performed on the data signal.

The ECC engine 320 may perform an ECC encoding and/or an ECC decoding on the data DQ according to a control of the control logic circuit 210.

The control logic circuit 210 may control some or all operations of the semiconductor memory device 200. For example, the control logic circuit 210 may generate control signals for the semiconductor memory device 200a in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding one or more of a write enable signal, a row address strobe signal, a column address strobe signal, a chip select signal, etc. The command decoder 211 (e.g., the control logic circuit 210) may generate a first control signal CTL1 for controlling the I/O gating circuit, a second control signal CTL2 for controlling the ECC engine 320 and a third control signal CTL3 for controlling the data I/O buffer 295 by decoding the command CMD. The third control signal CTL3 may include operating information associated with a write operation of the semiconductor memory device 200.

The ODT circuit 297 may be connected to a data I/O pad 299 and the data I/O buffer 295. When the ODT circuit 297 is enabled, the ODT circuit 297 may perform ODT operation. When the ODT operation is performed, signal integrity of transmitted/received signal may be enhance by preventing or reducing the likelihood of signal reflection due to impedance matching.

Although the semiconductor memory device included in the memory system according to various example embodiments is described based on a DRAM, the semiconductor memory device according to various example embodiments may be or may include or be included in any volatile memory device, and/or any nonvolatile memory device, e.g., one or more of a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 6:
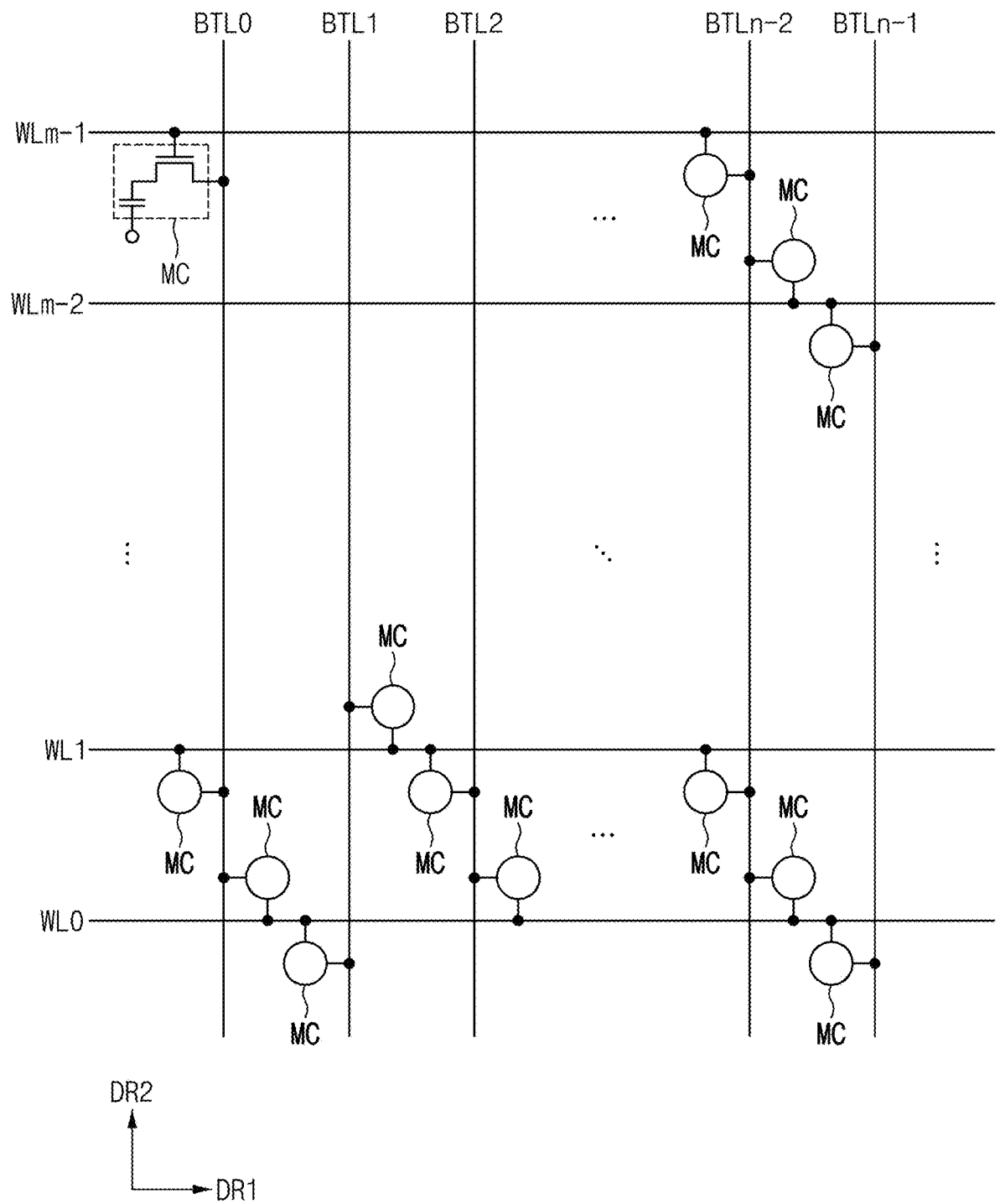
FIG. 6 illustrates an example of the first bank array in the semiconductor memory device of FIG. 5.

FIG. 6 illustrates an example of the first bank array in the semiconductor memory device of FIG. 5.

Referring to FIG. 6, the first bank array 310a may include a plurality of rows word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. In various example embodiments, m may be equal to, less than, or greater than n. Each of the memory cells MCs includes a cell transistor or an access transistor such as an NMOS transistor coupled to each of the word-lines WL0~WLm−1 and each of the bit-lines BTL0~BTLn−1 and a cell memory storage element such as a cell capacitor or a cell memristor coupled to the cell transistor. Each of the memory cells MCs may have a DRAM cell structure. Each of the word-lines WL0~WLm−1 extends in a first direction DR1 and each of the bit-lines BTL1~BTLn−1 extends in a second direction DR2 crossing the first direction DR1.

The word-lines WL0~WLm−1 coupled to the plurality of memory cells MCs may be referred to as rows of the first bank array 310a and the bit-lines BTL0~BTLn−1 coupled to the plurality of memory cells MCs may be referred to as columns of the first bank array 310a.

Figure 7:
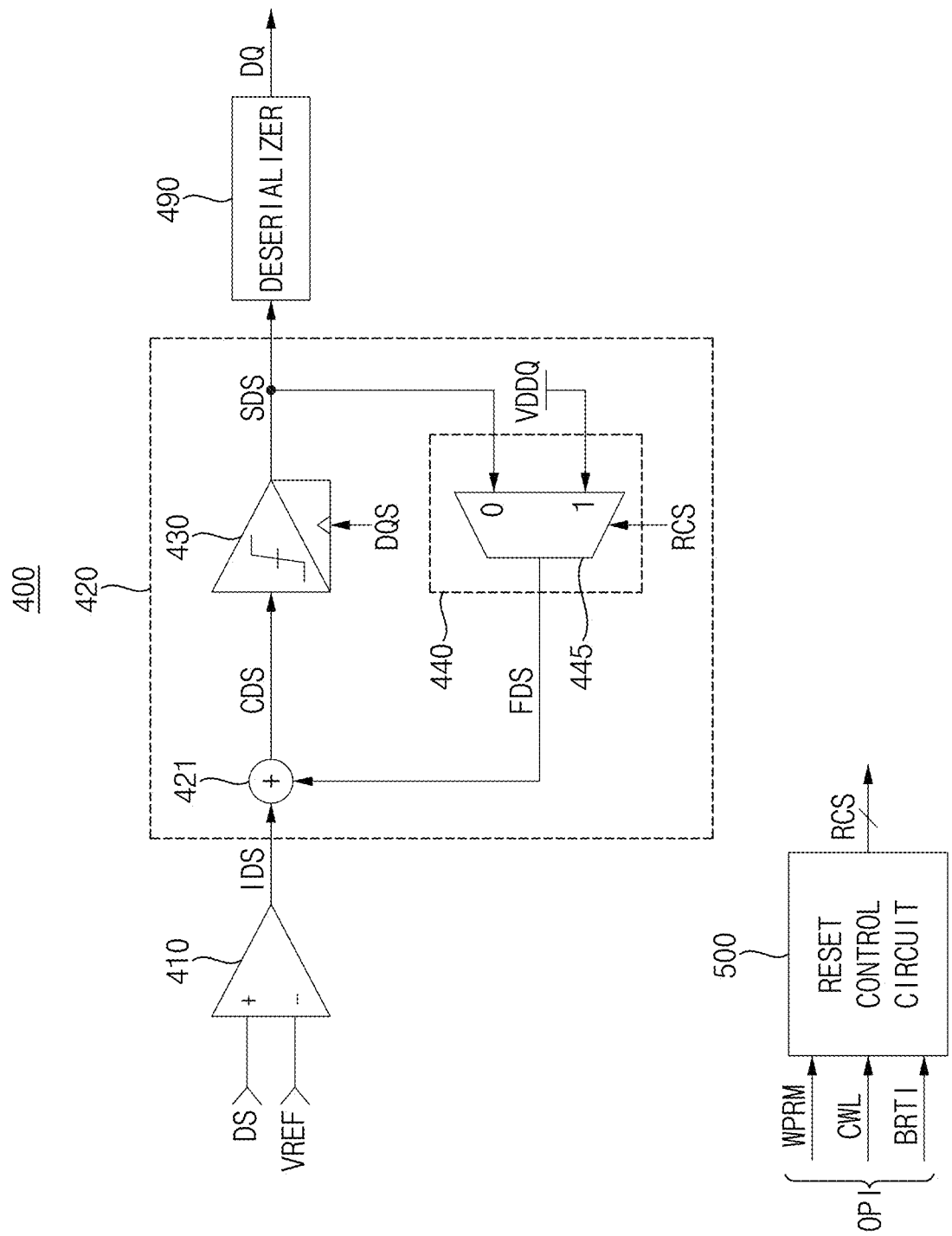
FIG. 7 is a block diagram illustrating an example of a receiver according to various example embodiments.

FIG. 7 is a block diagram illustrating an example of a receiver according to various example embodiments.

Referring to FIG. 7, a receiver 400 may include a buffer 410, a decision feedback equalizer 420, a deserializer 490 and a reset control circuit 500.

The buffer 410 may receive the data signal DS and may generate an internal data signal IDS by comparing the received data signal DS with a reference voltage VREF. The buffer 410 may include a positive input terminal to receive the data signal DS, a negative input terminal to receive the reference voltage VREF, and an output terminal to provide the internal data signal IDS. The buffer 410 may be referred to as an amplifier such as an operational amplifier.

The decision feedback equalizer 420 may generate a sampled signal SDS based on a current value or a present value of the internal data signal IDS and on a feedback signal FDS, and may provide the sampled signal SDS corresponding to a previous value of the internal data signal IDS or a first logic level based on a power supply voltage VDDQ as the feedback signal FDS based on a reset control signal RCS.

The decision feedback equalizer 420 may include a summer 421, a slicer 430 and a selection circuit 440.

The summer 421 may generate a compensated data signal CDS by summing the internal data signal IDS and the feedback signal FDS. The slicer 430 may output the sampled signal SDS by sampling the compensated data signal CDS based on the data strobe signal DQS.

The selection circuit 440 may provide the sampled signal SDS or the first logic level as the feedback signal FDS based on the reset control signal RCS. The selection circuit 440 may include a multiplexer 445. The multiplexer 445 may include a first input terminal receiving the sampled signal SDS, a second input terminal connected to a power supply voltage VDDQ, a control terminal receiving the reset control signal RCS and an output terminal providing the feedback signal FDS.

The reset control signal RCS may have a second logic level (e.g., a logic low level) in the first operation mode in which the write operation is performed on the data signal DS and may have a first logic level (e.g., a logic high level) in the second operation mode in which the write operation is not performed on the data signal DS.

Therefore, the decision feedback equalizer 420 may update the feedback signal FDS with the sampled signal SDS in the first operation mode in which the write operation is performed on the data signal DS, and may reset the feedback signal FDS with the first logic level based on the power supply voltage VDDQ in the second operation mode in which the write operation is not performed on the data signal DS.

The deserializer 490 may generate a deserialized data DQ by deserializing the sampled signal SDS. The deserialized data DQ may be referred to as an output data.

The reset control circuit 500 may generate the reset control signal RCS based on operating information OPI associated with the write operation of the data signal DS and may provide the reset control signal RCS to the decision feedback equalizer 420.

The operating information OPI may include a write preamble WPRM associated with the starting of the write operation, a time information CWL corresponding to a time interval from a time point at which a previous write operation is performed to a time point at which a successive write operation is to be performed, and a burst information BRTI associated with a burst operation of the write operation. The time information CWL may correspond to a column address strobe (CAS) write latency.

The reset control circuit 500 may output the reset control signal RCS with a second logic level in the first operation mode in which the write operation is performed on the data signal DS, and may output the reset control signal RCS with a first logic level in the second operation mode in which the write operation is not performed on the data signal DS based on the operating information OPI, which includes the write preamble WPRM, the burst information BRTI and the time information CWL.

The write preamble WPRM, the burst information BRTI, and the time information CWL may be set in the mode register 212 in FIG. 5 and the operating information OPI may be included in the third control signal CTL3 in FIG. 5.

Therefore, the decision feedback equalizer 420 may secure or may more likely secure substantially the same timing margin with respect to bits of the sampled signal SDS as for operation of the deserializer 490 which generates the output data DQ by deserializing the sampled signal SDS, by adaptively resetting the feedback signal FDS with the first logic level in the second operation mode in which the write operation is not performed on the data signal DS, based on the operating information OPI. For example, in the second operation mode, the decision feedback equalizer 420 is stably or more stable reset and secures or is more likely to secure an operating timing margin of the deserializer 490 by setting the feedback signal FDS with the first logic level based on the reset control signal RCS instead of resetting an output of the slicer 430.

Figure 8:
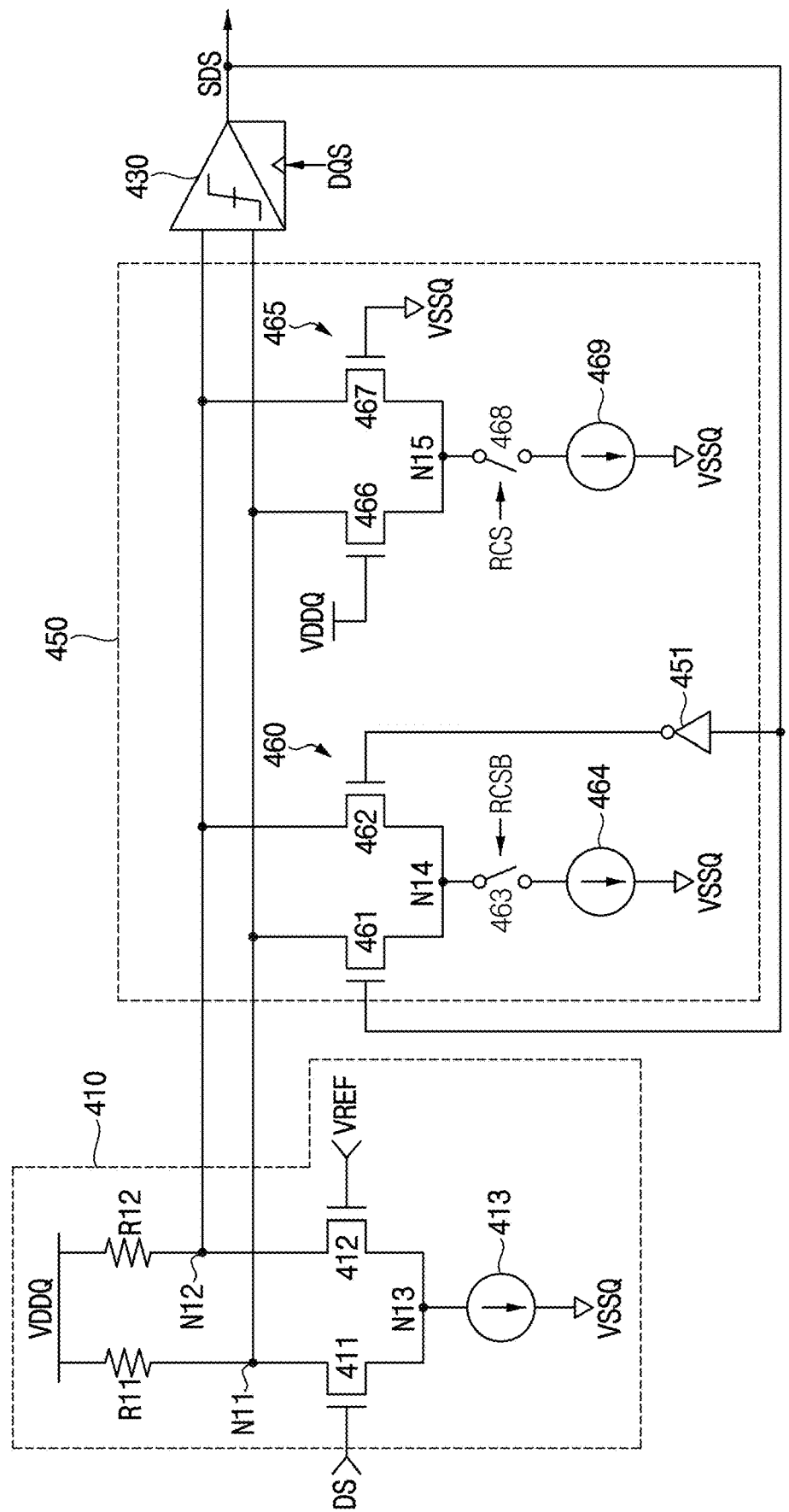
FIG. 8 illustrates an example of the buffer and the selection circuit in the receiver of FIG. 7 according to various example embodiments.

FIG. 8 illustrates an example of the buffer and the selection circuit in the receiver of FIG. 7 according to various example embodiments.

In FIG. 8, the slicer 430 is also illustrated for convenience of explanation.

Referring to FIG. 8, the buffer 410 may have a configuration of an amplifier. The buffer 410 may include a first resistor R11 connected between the power supply voltage VDDQ and a first node N11, a second resistor R12 connected between the power supply voltage VDDQ and a second node N12, transistors such as n-channel metal oxide semiconductor (NMOS) transistors 411 and 412, and a current source 413. The first node N11 may be connected to a first input terminal of the slicer 410 and the second node N12 may be connected to a second input terminal of the slicer 410.

The NMOS transistor 411 may be connected between the first node N11 and a third node N13 and may have a gate receiving the data signal DS. The NMOS transistor 412 may be connected between the second node N12 and the third node N13 and may have a gate receiving the reference voltage VREF. The current source 413 may be connected between the third node N13 and a ground voltage VSSQ.

A circuit 450 may include a normal tap 460, a reset tap 465 and an inverter 451. The circuit 450 may correspond to the selection circuit 440; example embodiments are not limited thereto.

The normal tap 460 may include NMOS transistors 461 and 462, a switch 463 and a current source 464.

The NMOS transistor 461 may be connected between the first node N11 and a fourth node N14 and may have a gate receiving the sampled signal SDS. The NMOS transistor 462 may be connected between the second node N11 and the fourth node N14 and may have a gate receiving an inverted version of the sampled signal SDS by the inverter 451. The switch 463 may be connected between the fourth node N14 and the current source 464 and may selectively connect the fourth node N14 to the current source 464 in response to an inverted reset control signal RCSB. The current source 464 may be connected between the switch 463 and the ground voltage VDDQ.

The reset tap 465 may include NMOS transistors 466 and 467, a switch 468 and a current source 469.

The NMOS transistor 466 may be connected between the first node N11 and a fifth node N15 and may have a gate coupled to the power supply voltage VDDQ. The NMOS transistor 467 may be connected between the second node N12 and the fifth node N15 and may have a gate coupled to the ground voltage VSSQ. The switch 468 may be connected between the fifth node N15 and the current source 469 and may selectively connect the fifth node N15 to the current source 469 in response to the reset control signal RCS. The current source 469 may be connected between the switch 468 and the ground voltage VDDQ.

Therefore, in the first operation mode in which the write operation is performed on the data signal DS, the reset control signal RCS may be deactivated, the inverted reset control signal RCSB may be activated, and voltage levels of the first node N11 and the second node N12 may be varied by the NMOS transistors 411 and 412 based on the sampled signal SDS and the inverted version of the sampled signal SDS. In addition, in the second operation mode in which the write operation is not performed on the data signal DS, the reset control signal RCS is activated, the inverted reset control signal RCSB is deactivated, the NMOS transistor 466 is turned-on based on the power supply voltage VDDQ, and the NMOS transistor 467 is turned-off based on the ground voltage VSSQ. Accordingly, the voltage level of the first node N11 may be additionally varied by the NMOS transistor 466.

The slicer 430 may output the sampled signal SDS by sampling the voltage level of the first node N11 based on the data strobe signal DQS.

Figure 9A:
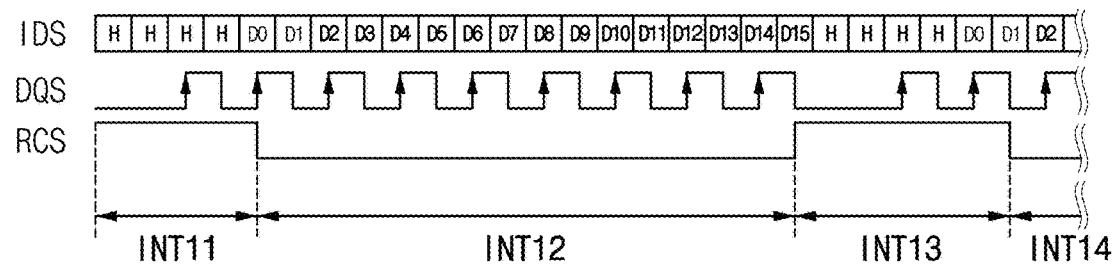
FIG. 9A illustrates an example operation of the receiver of FIG. 7 according to various example embodiments.

FIG. 9A illustrates an example operation of the receiver of FIG. 7 according to various example embodiments.

Referring to FIGS. 7 and 9A, the decision feedback equalizer 420 operates in the second operation mode in each of a first time interval INT11 and a third time interval INT13 during which the data signal DS (or, the internal data signal IDS) is not received from the memory controller 100 and the write operation is not performed on the data signal DS, the reset control signal RCS has a first logic level in each of the first time interval INT11 and the third time interval INT13 and the feedback signal FDS is reset to a first logic level ('H') in each of the first time interval INT11 and the third time interval INT13.

The decision feedback equalizer 420 operates in the first operation mode in each of a second time interval INT12 and a fourth time interval INT14 during which the data signal DS is normally received from the memory controller 100 and the write operation is performed on the data signal DS, the reset control signal RCS has a second logic level in each of the second time interval INT12 and the fourth time interval INT14 and the sampled signal SDS is updated as the feedback signal FDS in each of the second time interval INT12 and the fourth time interval INT14. The slicer 430 may provide the sampled signal SDS by sequentially sampling bits D0~D15 of the data signal DS in response to a rising edge of the data strobe signal DQS.

Figure 9B:
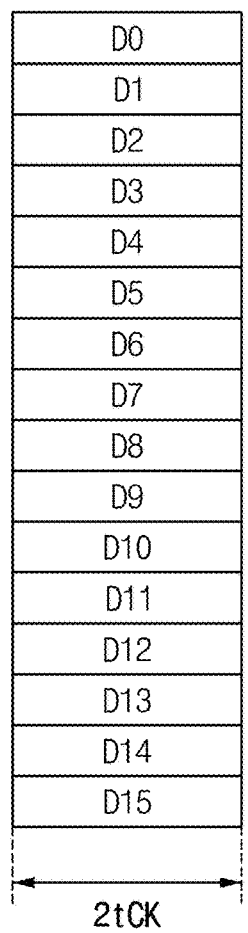
FIG. 9B illustrates an example operation of the deserializer in the receiver of FIG. 7 according to various example embodiments.

FIG. 9B illustrates an example operation of the deserializer in the receiver of FIG. 7 according to various example embodiments.

Referring to FIGS. 7 and 9B, the deserializer 490 may provide the output signal DQ by deserializing bits D0~D15 of the sampled signal SDS during a timing window 2$t$CK.

Therefore, an operating timing margin of the deserializer 490 may be secured or may be more likely secured.

Figure 9C:
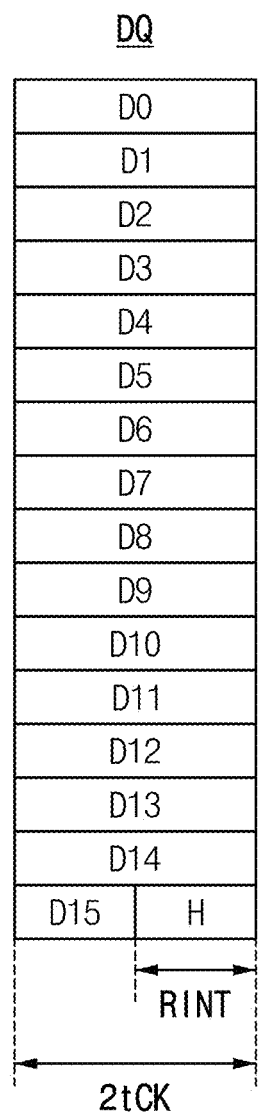
FIG. 9C illustrates an example operation of the deserializer in the receiver of FIG. 7 when the sampled signal is forcibly reset, according to various example embodiments.

FIG. 9C illustrates an example operation of the deserializer in the receiver of FIG. 7 when the sampled signal is forcibly reset.

Referring to FIGS. 7 and 9C, when the output of the slicer 430 is forcibly reset instead of employing the selection circuit 440, the deserializer 490 provides the output signal DQ by deserializing bits DO~D14 of the sampled signal SDS during a timing window 2tCK and deserializing bit D15 of the sampled signal SDS during a time interval obtained by subtracting a reset interval RINT from the timing window 2tCK. Accordingly, a valid window of the last bit D15 is reduced and an operating timing margin of the deserializer 490 is reduced.

Figure 10:
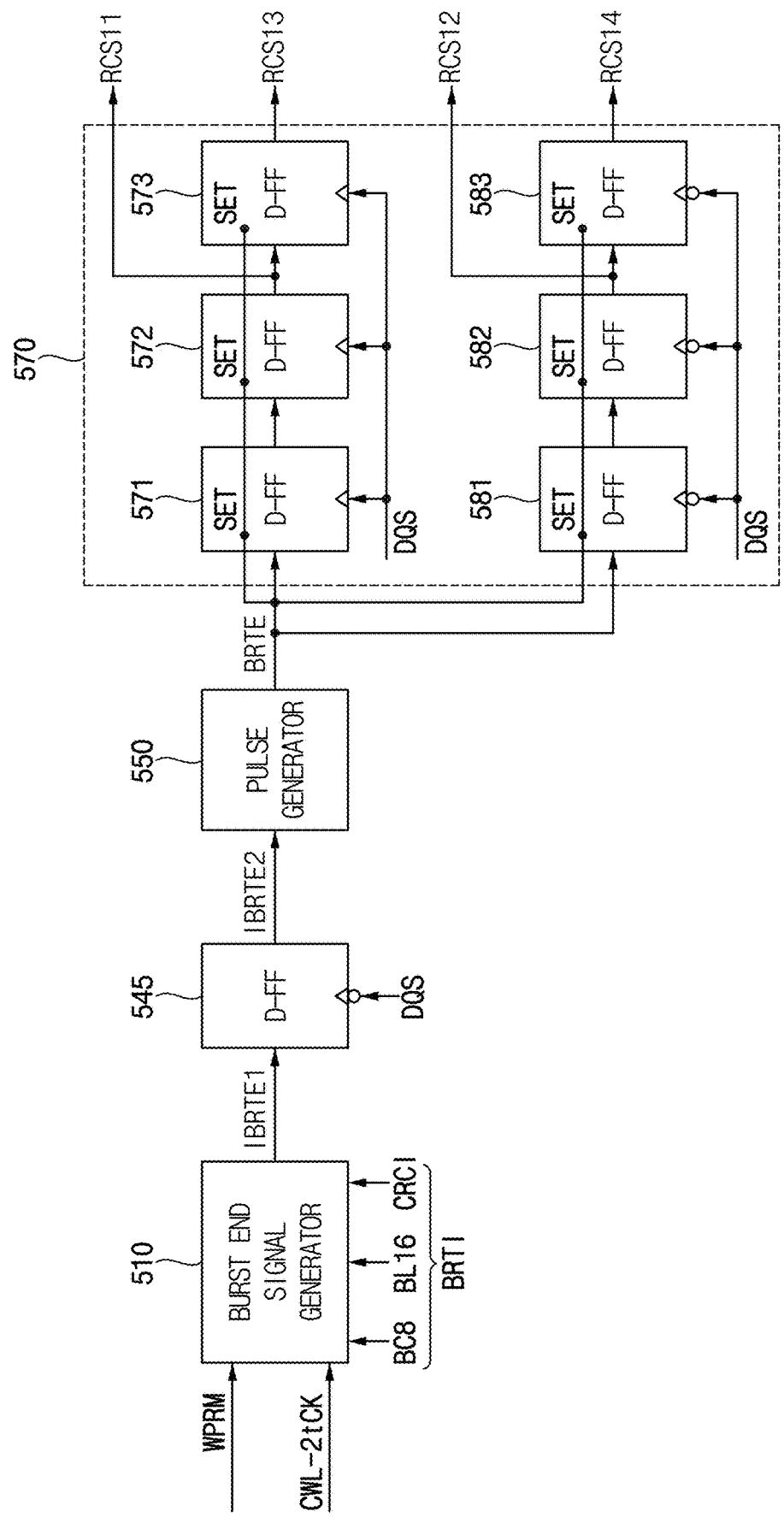
FIG. 10 is a block diagram illustrating an example of the reset control circuit in the receiver of FIG. 7 according to various example embodiments.

FIG. 10 is a block diagram illustrating an example of the reset control circuit in the receiver of FIG. 7 according to various example embodiments.

Referring to FIG. 10, the reset control circuit 500 may include a burst end signal generator 510, a flipflop D-FF 545, a pulse generator 550 and a reset control signal generator 570.

The burst end signal generator 510 may generate a first internal burst end signal IBRTE1 indicating a completion of the write operation based on the write preamble WPRM, a time information CWL−2tCK, and the burst information BRTI. The burst information BRTI may include a burst length informationBL16, a burst chop information BC8, and a cyclic redundancy check (CRC) information CRCI. The burst length information BL16 may be associated with associated with a burst length indicating a number of data bits which are inputted successively in the write operation performed based on one write command. The burst chop information BC8 may indicate a number of data bits which are not used in the burst length.

The flipflop (e.g., D-flipflop) 545 may generate a second internal burst end signal IBRTE2 by delaying the first internal burst end signal IBRTE1 based on the data strobe signal DQS. The flipflop 545 may generate the second internal burst end signal IBRTE2 by delaying the first internal burst end signal IBRTE1 in synchronization with a falling edge of the data strobe signal DQS.

The pulse generator 550 may generate a burst end signal BRTE having a first activation interval based on the second internal burst end signal IBRTE2.

The reset control signal generator 570 may generate a plurality of sub reset control signals RCS11. RCS12, RCS13 and RCS14 of the reset control signal RCS based on the burst end signal BRTE and the data strobe signal DQS.

The reset control signal generator 570 may include a plurality of first D-flipflops 571, 572 and 573 and a plurality of second D-flipflops 581, 582 and 583.

The plurality of first D-flipflops 571, 572, and 573 may be cascaded-connected and may generate a first sub reset control signal RCS11 and a third reset control signal RCS13 from among the plurality of sub reset control signals RCS11. RCS12, RCS13 and RCS14 by sequentially delaying the burst end signal BRTE based on a rising edge of the data strobe signal DQS. An output of the D-flipflop 572 may be provided as the first sub reset control signal RCS11 and an output of the D-flipflop 573 may be provided as the third sub reset control signal RCS13. The plurality of first D-flipflops 571, 572 and 573 may be set in response to the burst end signal BRTE.

The plurality of second D-flipflops 581, 582 and 583 may be cascaded-connected and may generate a second sub reset control signal RCS12 and a fourth reset control signal RCS14 from among the plurality of sub reset control signals RCS11. RCS12, RCS13 and RCS14 by sequentially delaying the burst end signal BRTE based on a falling edge of the data strobe signal DQS. An output of the D-flipflop 582 may be provided as the second sub reset control signal RCS12 and an output of the D-flipflop 583 may be provided as the fourth sub reset control signal RCS14. The plurality of second D-flipflops 581, 582 and 583 may be set in response to the burst end signal BRTE.

Figure 11:
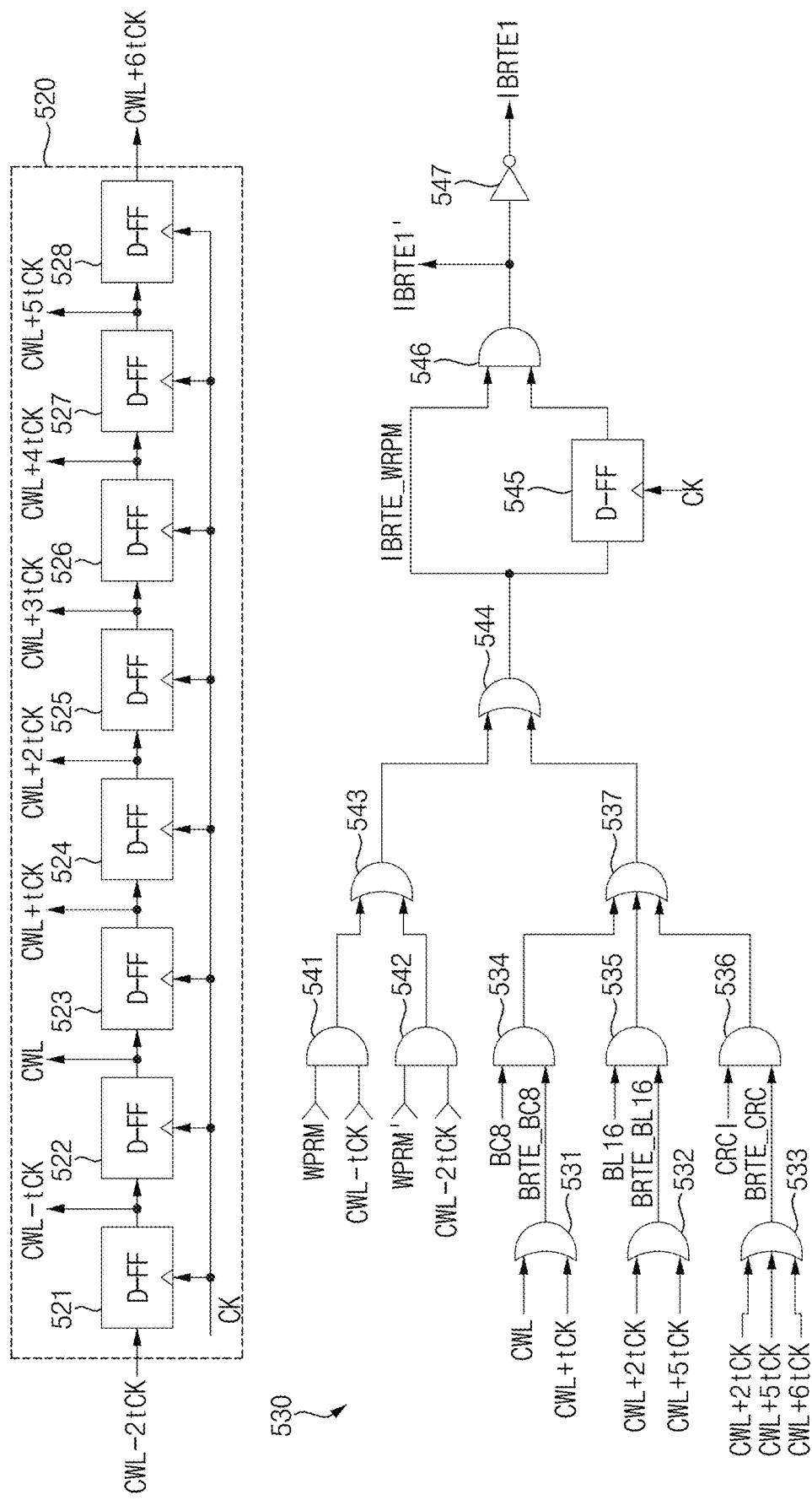
FIG. 11 is a circuit diagram illustrating an example of the burst end signal generator in FIG. 10 according to various example embodiments.

FIG. 11 is a circuit diagram illustrating an example of the burst end signal generator in FIG. 10 according to various example embodiments.

Referring to FIG. 11, the burst end signal generator 510 may include a first sub circuit 520 and a second sub circuit 530.

The first sub circuit 520 may generate a plurality of sub time information, for example sub time information CWL−tCK, CWL, CWL+tCK, CWL+2tCK, CWL+3tCK, CWL+4tCK, CWL+5tCK, and CWL+6tCK having regular time interval based on the time information CWL−2tCK and the clock signal CK.

The first sub circuit 520 may include a plurality of D-flipflops 521, 522, 523, 524, 525, 526, 527, and 528 which are cascaded-connected and the plurality of D-flipflops 521, 522, 523, 524, 525, 526, 527, and 528 may generate the plurality of sub time information CWL−tCK, CWL, CWL+tCK, CWL+2tCK, CWL+3tCK, CWL+4tCK, CWL+5tCK, and CWL+6tCK by sequentially delaying the time information CWL−2tCK in synchronization with a rising edge of the clock signal CK.

The second sub circuit 530 may generate the first internal burst end signal IBRTE1 based on the time information CWL−2tCK, the plurality of sub time information CWL−tCK, CWL, CWL+tCK, CWL+2tCK, CWL+3tCK, CWL+4tCK, CWL+5tCK, and CWL+6tCK, the write preamble WPRM, and the clock signal CK.

The second sub circuit 530 may include OR gates 531, 532, and 533, AND gates 534, 535, 536, 541, and 542, OR gates 537, 543, and 544, a D-flipflop 545, an AND gate 546, and an inverter 547.

The OR gate 531 may perform an OR operation on the sub time information CWL and CWL+tCK to generate a signal BRTE_BC8. The OR gate 532 may perform an OR operation on the sub time information CWL+2tCK and CWL+5tCK to generate a signal BRTE_BL16. The OR gate 533 may perform an OR operation on the sub time information CWL+2tCK, CWL+5tCK, and CWL+6tCK to generate a signal BRTE_CRC.

The AND gate 534 may perform an AND operation on the burst chop information BC8 and the signal BRTE_BC8. The AND gate 535 may perform an AND operation on the burst length information BL16 and the signal BRTE_BL16. The AND gate 536 may perform an AND operation on the CRC information CRCI and the signal BRTE_CRC.

The OR gate 537 may perform an OR operation on outputs of the AND gates 534, 535 and 536.

The AND gate 541 may perform an AND operation on the write preamble WPRM and the sub time information CWL−tCK. The AND gate 542 may perform an AND operation on an inverted write preamble WPRM' and the sub time information CWL−2tCK. The OR gate 543 may perform an OR operation on outputs of the AND gates 541 and 542.

The OR gate 544 may perform an OR operation on outputs of the OR gates 537 and 543 to output a signal IBRTE_WPRM. The D-flipflop 545 may delay the signal IBRTE_WPRM based on the clock signal CK.

The AND gate 546 may perform an AND operation on the signal IBRTE_WPRM and an output of the D-flipflop 545 to output a signal IBRTE1'. The inverter 547 may output the first internal burst end signal IBRTE1 by inverting the signal IBRTE1'.

Figure 12:
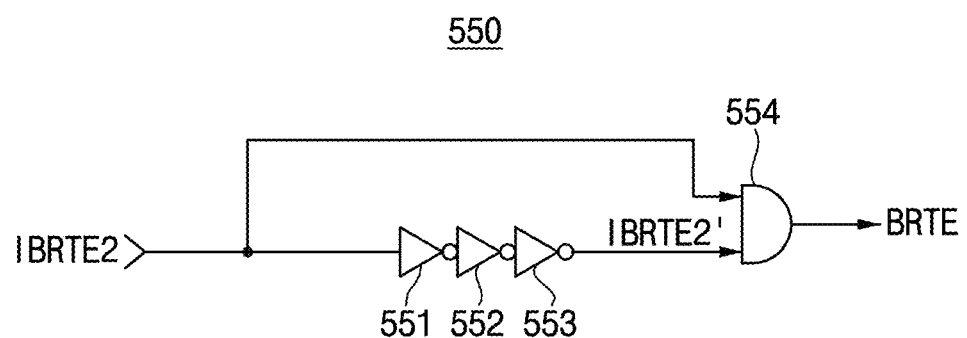
FIG. 12 is a circuit diagram illustrating an example of the pulse generator in FIG. 10 according to various example embodiments.

FIG. 12 is a circuit diagram illustrating an example of the pulse generator in FIG. 10 according to various example embodiments.

Referring to FIG. 12, the pulse generator 550 may include an odd number of inverters 551, 552, and 553 and an AND gate 554.

The odd number of inverters 551, 552, and 553 may be cascaded-connected and may generate an inverted second internal burst end signal IBRTE2' by sequentially inverting the second internal burst end signal IBRTE2. The AND gate 554 may perform an AND operation on the second internal burst end signal IBRTE2 and the inverted second internal burst end signal IBRTE2' to output the burst end signal BRTE having the first activation interval.

The first activation interval of the burst end signal BRTE may correspond to delay time intervals of the odd numbers of inverters 551, 552 and 553.

Figure 13:
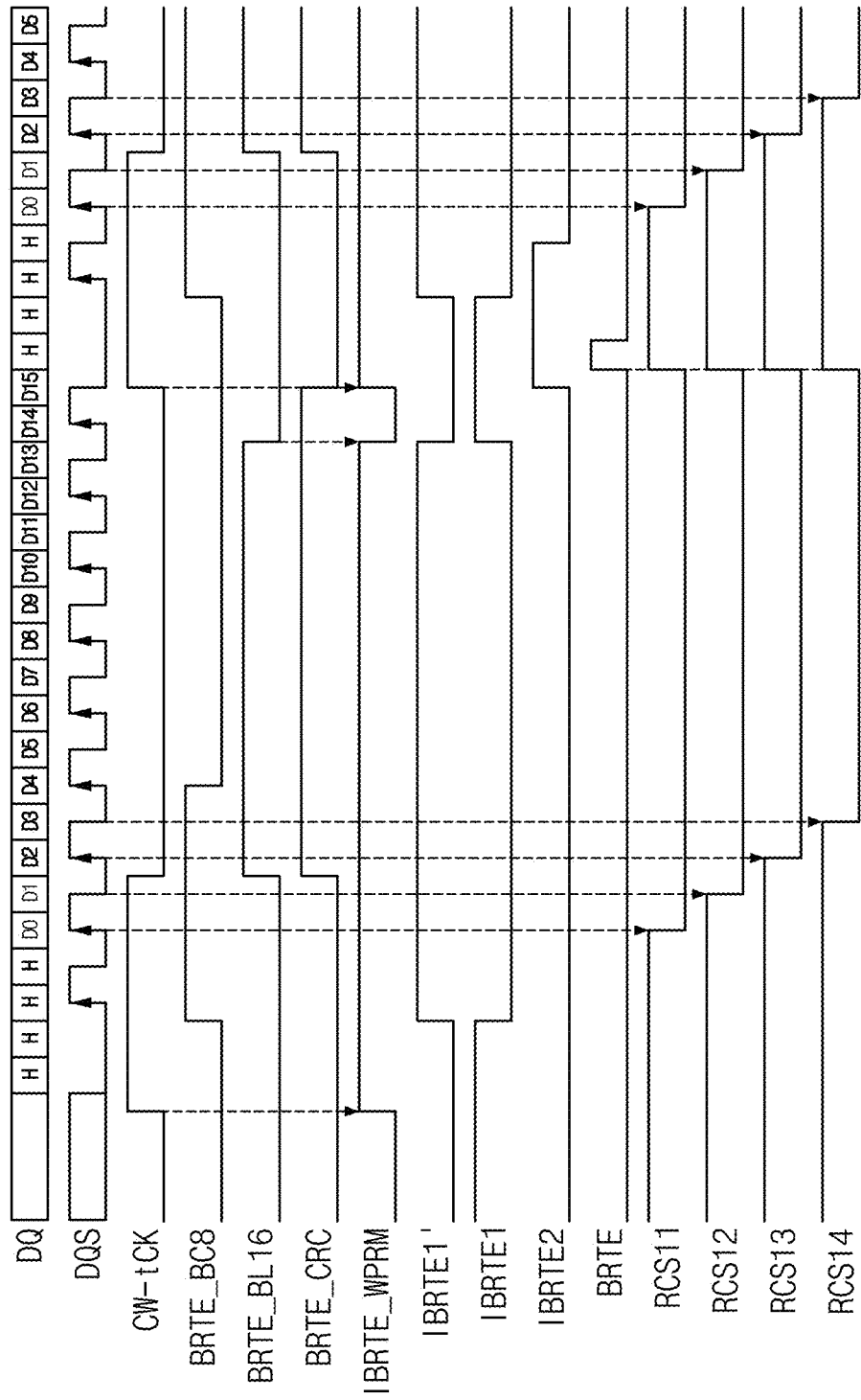
FIG. 13 is a timing diagram illustrating signals in FIGS. 10, 11 and 12 according to various example embodiments.

FIG. 13 is a timing diagram illustrating signals in FIGS. 10, 11 and 12 according to various example embodiments.

Referring to FIG. 13, during a time interval in which the data signal DS and the data strobe signal DQS are not normally received, the sub time information CWL−tCK has a logic low level, each of the signals BRTE_BC8, BRTE_BL16 and BRTE_CRC has a logic low level and on the signal IBRTE_WPRM transitions to a logic high level in response to the sub time information CWL−tCK transitioning to a logic high level.

The sub time information CWL−tCK transitions to a logic high level and is maintained at the logic high level during a first time interval, the signal BRTE_BC8 transitions to a logic high level and is maintained at the logic high level during a second time interval, the data signal DS and the data strobe signal DQS are normally received, the signal BRTE_BL16 transitions to a logic high level and is maintained at the logic high level during a third time interval, and the signal BRTE_CRC transitions to a logic high level in parallel with the signal BRTE_BL16 and is maintained at the logic high level during a fourth time interval.

The signal IBRTE_WPRM transitions to a logic high level in response to a rising edge of the sub time information CWL−tCK, transitions to a logic low level in response to a falling edge of the signal BRTE_BL16, and transitions to a logic high level in response to a rising edge of the sub time information CWL−tCK.

The signal IBRTE1' (e.g., an output of the AND gate 546) transitions to a logic high level with a delay with respect to the signal IBRTE_WPRM, transitions to a logic low level in response to a falling edge of the signal IBRTE_WPRM and transitions to a logic high level with a delay with respect to the signal IBRTE_WPRM.

The first internal burst end signal IBRTE1 is an inverted version of the signal IBRTE1', the second internal burst end signal IBRTE2 is generated by delaying the first internal burst end signal IBRTE1 in response to a falling edge of the data strobe signal DQS, and the burst end signal BRTE is activated in response to a rising edge of the second internal burst end signal IBRTE2 and has a first activation interval.

When the first bit D0 of the data signal DS associated with a first write operation is sampled in response to a rising edge of the data strobe signal DQS, the first sub reset control signal RCS11 transitions to a logic low level from a logic high level to designate the first operation mode and transitions to a logic high level in response to a rising edge of the burst end signal BRTE to designate the second operation mode. When the first bit D0 of the data signal DS associated with a second write operation is sampled in response to a rising edge of the data strobe signal DQS, the first sub reset control signal RCS11 transitions to a logic low level from a logic high level to designate the first operation mode.

When the second bit D1 of the data signal DS associated with the first write operation is sampled in response to a rising edge of the data strobe signal DQS, the second sub reset control signal RCS12 transitions to a logic low level from a logic high level to designate the first operation mode and transitions to a logic high level in response to a rising edge of the burst end signal BRTE to designate the second operation mode. When the second bit D1 of the data signal DS associated with a second write operation is sampled in response to a rising edge of the data strobe signal DQS, the second sub reset control signal RCS12 transitions to a logic low level from a logic high level to designate the first operation mode.

When the third bit D2 of the data signal DS associated with the first write operation is sampled in response to a rising edge of the data strobe signal DQS, the third sub reset control signal RCS13 transitions to a logic low level from a logic high level to designate the first operation mode and transitions to a logic high level in response to a rising edge of the burst end signal BRTE to designate the second operation mode. When the third bit D2 of the data signal DS associated with a second write operation is sampled in response to a rising edge of the data strobe signal DQS, the third sub reset control signal RCS14 transitions to a logic low level from a logic high level to designate the first operation mode.

When the fourth bit D3 of the data signal DS associated with the first write operation is sampled in response to a rising edge of the data strobe signal DQS, the fourth sub reset control signal RCS14 transitions to a logic low level from a logic high level to designate the first operation mode and transitions to a logic high level in response to a rising edge of the burst end signal BRTE to designate the second operation mode. When the fourth bit D3 of the data signal DS associated with a second write operation is sampled in response to a rising edge of the data strobe signal DQS, the fourth sub reset control signal RCS14 transitions to a logic low level from a logic high level to designate the first operation mode.

Figure 14:
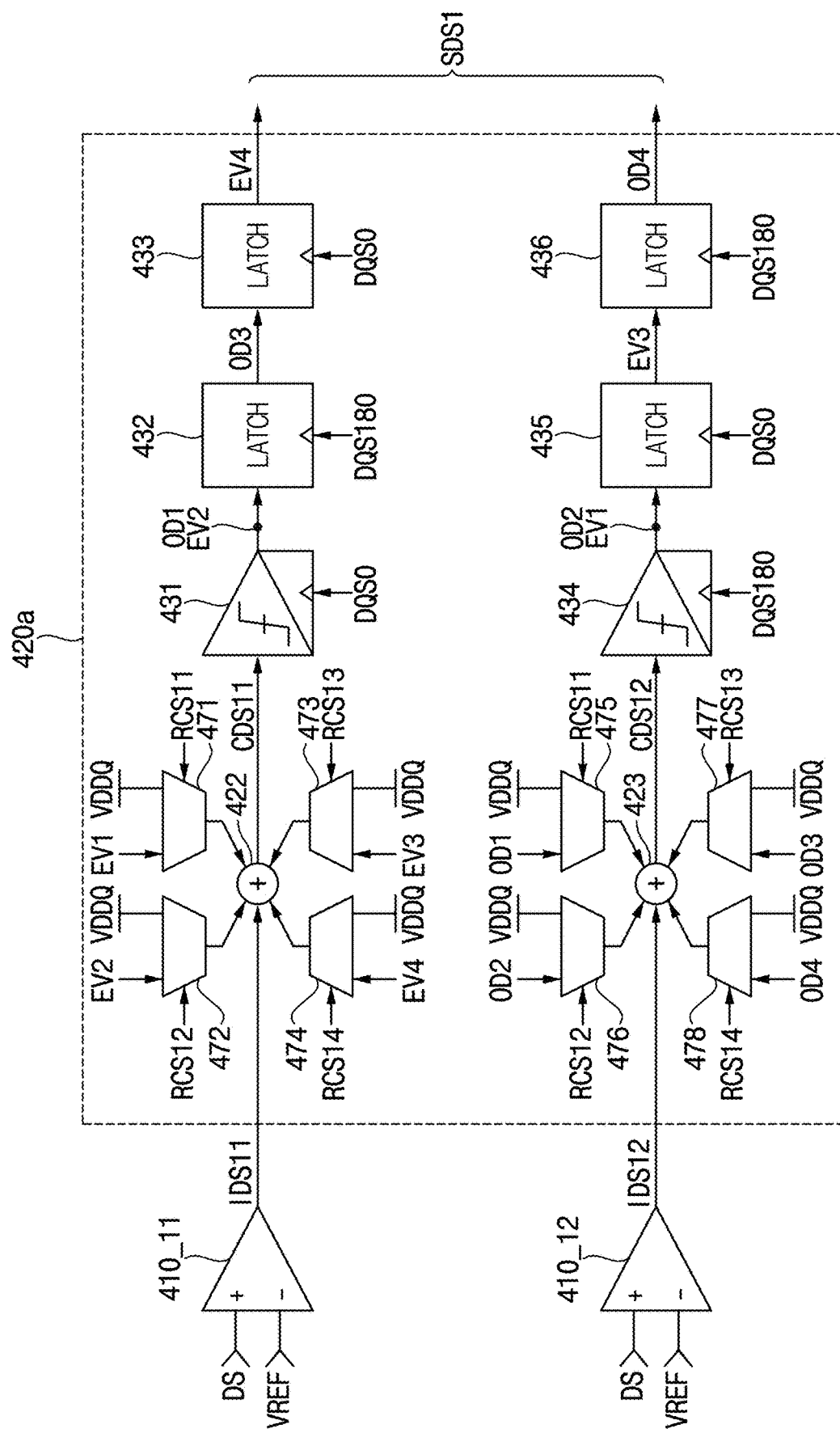
FIG. 14 is a block diagram illustrating an example of a decision feedback equalizer in the receiver of FIG. 7 according to various example embodiments.

FIG. 14 is a block diagram illustrating an example of a decision feedback equalizer in the receiver of FIG. 7 according to various example embodiments.

In FIG. 14, sub buffers 410_11 and 410_12 are also illustrated for convenience of explanation. The sub buffers 410_11 and 410_12 may be included in the buffer 410 in FIG. 7. The sub buffer 410_11 may receive the data signal DS and may generate an internal data signal IDS11 by comparing the received data signal DS with the reference voltage VREF. The sub buffer 410_12 may receive the data signal DS and may generate an internal data signal IDS12 by comparing the received data signal DS with the reference voltage VREF. The internal data signals IDS11 and IDS12 may correspond to the internal data signal IDS in FIG. 7.

In FIG. 14, assuming that the data strobe signal DQS in FIG. 7 includes first strobe signal DQS0 and a second strobe signal DQS180 that have a phase difference of 180 degrees with respect to each other. The data strobe signal DQS may be a differential strobe signal.

Referring to FIG. 14, a decision feedback equalizer 420*a* may include a first summer 422, a first slicer 432, a first latch 432, a second latch 433, a plurality of first multiplexers 471, 472, 473 and 474, a second summer 423, a second slicer 434, a third latch 435, a fourth latch 436 and a plurality of second multiplexers 475, 476, 477 and 478.

The first summer 422 may generate a first compensated data signal CDS11 by summing the internal data signal IDS11 and a first feedback signal corresponding to outputs of the plurality of first multiplexers 471, 472, 473 and 474.

The first slicer 432 may generate a first odd bit OD1 of odd bits and a second even bit EV2 of a sampled signal by sampling the first compensated data signal CDS11 based on the first strobe signal DQS0. The first latch 432 may generate a third odd bit OD3 of the sampled signal by latching an output of the first slicer 431 based on the second strobe signal DQS180. The second latch 433 may generate a fourth even bit EV4 of the sampled signal by latching the third odd bit OD3 based on the first strobe signal DQS0.

The second summer 423 may generate a second compensated data signal CDS12 by summing the internal data signal IDS12 and a second feedback signal corresponding to outputs of the plurality of second multiplexers 475, 476, 477 and 478.

The second slicer 434 may generate a first even bit EV11 of odd bits and a second odd bit OD2 of the sampled signal by sampling the second compensated data signal CDS12 based on the second strobe signal DQS180. The third latch 434 may generate a third even bit EV3 of the sampled signal by latching an output of the second slicer 434 based on the first strobe signal DQS0. The fourth latch 436 may generate a fourth odd bit OD4 of the sampled signal by latching the third even bit EV3 based on the second strobe signal DQS180.

Each of the plurality of first multiplexers 471, 472, 473 and 474 may provide the first summer 422 with each of even bits EV1, EV2, EV3 and EV4 or a first logic level based on the power supply voltage VDDQ as the first feedback signal based on respective one of first through fourth sub reset control signals RCS11, RCS12, RCS13, and RCS14. Each of the plurality of second multiplexers 475, 476, 477, and 478 may provide the second summer 423 with each of odd bits OD1, OD2, OD3 and OD4 or a first logic level based on the power supply voltage VDDQ as the second feedback signal based on respective one of first through fourth sub reset control signals RCS11, RCS12, RCS13, and RCS14.

Therefore, the decision feedback equalizer 420a may provide the first feedback signal by interleaving even bits EV1, EV2, EV3, and EV4 of the sampled signal and provide the second feedback signal by interleaving odd bits OD1, OD2, OD3, and OD4 of the sampled signal in a first operation mode in which the write operation is performed on the data signal DS and may reset the first feedback signal and the second feedback signal with the first logic level in a second operation mode in which the write operation is not performed on the data signal DS based on the first strobe signal DQS0, the second strobe signal DQS180 and the plurality of sub reset control signals RCS11, RCS12, RCS13, and RCS14.

The even bits EV1, EV2, EV3, and EV4 and the odd bits OD1, OD2, OD3, and OD4 may be provided as a sampled signal SDS1.

Figure 15:
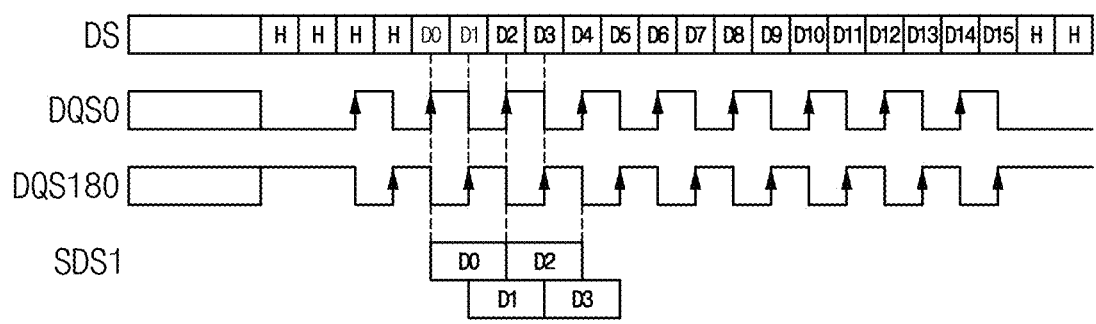
FIG. 15 is a timing diagram illustrating an operation of the decision feedback equalizer of FIG. 14 according to various example embodiments.

FIG. 15 is a timing diagram illustrating an operation of the decision feedback equalizer of FIG. 14 according to various example embodiments.

Referring to FIGS. 14 and 15, when the data signal DS is normally received, even bits D0 and D2 are sequentially latched based on a rising edge of the first strobe signal DQS0, and odd bits D1 and D3 are sequentially latched based on a rising edge of the second strobe signal DQS180 and thus the sampled signal SDS1 including the bits D0, D1, D2 and D3 is provided.

Figure 16:
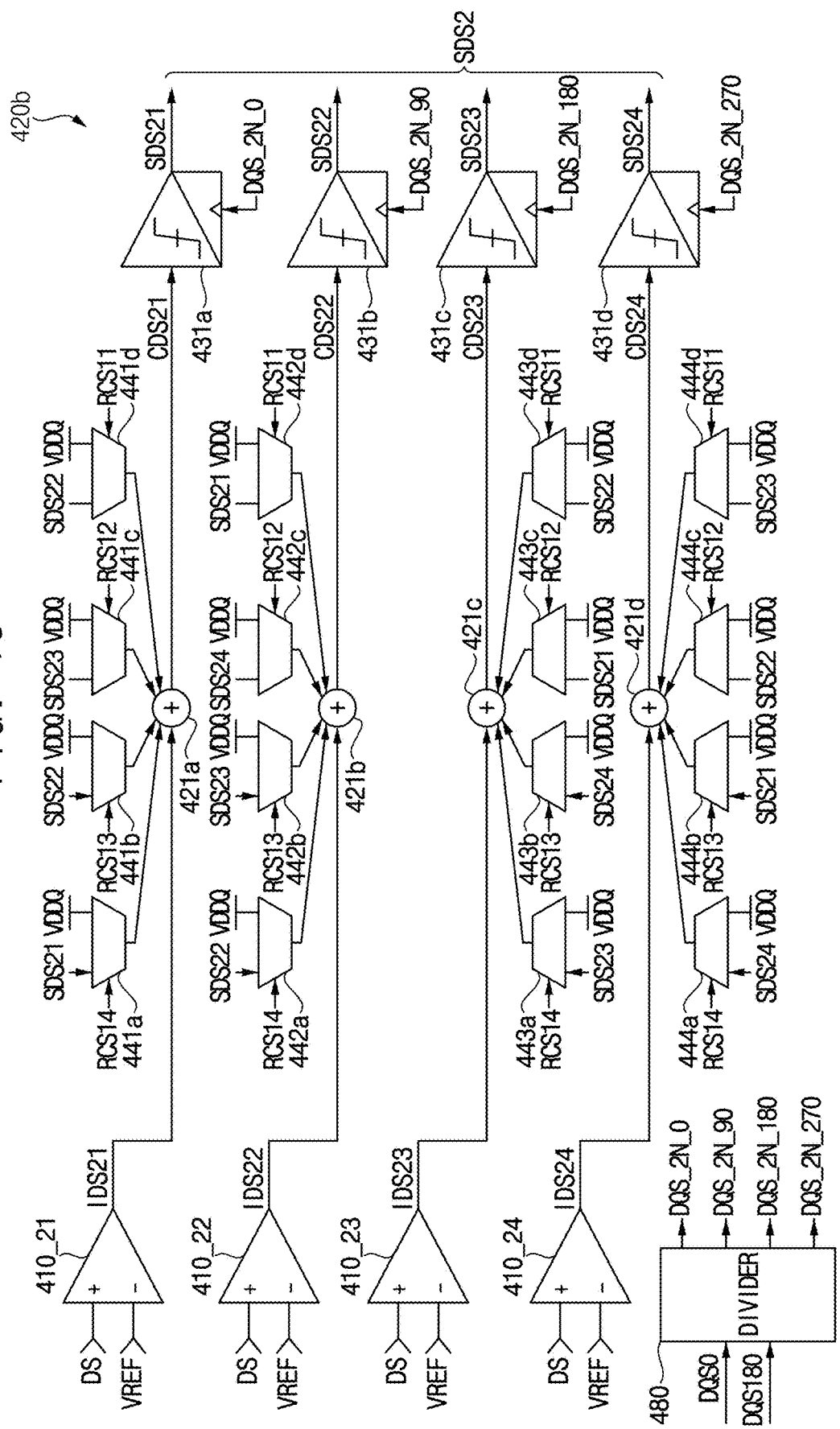
FIG. 16 is a block diagram illustrating an example of a decision feedback equalizer in the receiver of FIG. 7 according to various example embodiments.

FIG. 16 is a block diagram illustrating an example of a decision feedback equalizer in the receiver of FIG. 7 according to various example embodiments.

In FIG. 16, sub buffers 410_21, 410_22, 410_13, and 410_14 are also illustrated for convenience of explanation. The sub buffers 410_21, 410_22, 410_13, and 410_14 may be included in the buffer 410 in FIG. 7. The sub buffer 410_21 may receive the data signal DS and may generate an internal data signal IDS21 by comparing the received data signal DS with the reference voltage VREF. The sub buffer 410_22 may receive the data signal DS and may generate an internal data signal IDS22 by comparing the received data signal DS with the reference voltage VREF. The sub buffer 410_23 may receive the data signal DS and may generate an internal data signal IDS23 by comparing the received data signal DS with the reference voltage VREF. The sub buffer 410_24 may receive the data signal DS and may generate an internal data signal IDS24 by comparing the received data signal DS with the reference voltage VREF. The internal data signals IDS21, IDS22, IDS23, and IDS24 may correspond to the internal data signal IDS in FIG. 7.

In FIG. 16, assuming that the data strobe signal DQS in FIG. 7 includes first strobe signal DQS0 and a second strobe signal DQS180 that have a phase difference of 180 degrees with respect to each other. The data strobe signal DQS may be a differential strobe signal.

Referring to FIG. 16, a decision feedback equalizer 420b may include a divider 480, a first summer 421a, a second summer 421b, a third summer 421c, a fourth summer 421d, a first slicer 431a, a second slicer 431b, a third slicer 431c, a fourth slicer 431d, a plurality of first multiplexers 441a, 441b, 441c, and 441d, a plurality of second multiplexers 442a, 442b, 442c and 442d, a plurality of third multiplexers 443a, 443b, 443c, and 443d and a plurality of fourth multiplexers 444a, 444b, 444c, and 444d.

The divider 480 may generate first through fourth divided strobe signals DQS_2N_0, DQS_2N_90, DQS_2N_180, and DQS_2N_270 that have a phase difference of 90 degrees with respect to each other by dividing the first strobe signal DQS0 and the second strobe signal DQS180 and may provide each of the first through fourth divided strobe signals DQS_2N_0, DQS_2N_90, DQS_2N_180, and DQS_2N_270 to respective one of the first slicer 431a, the second slicer 431b, the third slicer 431c and the fourth slicer 431d.

The first summer 421a may generate a first compensated data signal CDS21 by summing the internal data signal IDS21 and a first feedback signal corresponding to outputs of the plurality of first multiplexers 441a, 441b, 441c, and 441d. The first slicer 431a may generate a first bit SDS21 of a sampled signal SDS2 by sampling the first compensated data signal CDS21 based on the first divided strobe signal DQS_2N_0.

The second summer 421b may generate a second compensated data signal CDS22 by summing the internal data signal IDS22 and a second feedback signal corresponding to outputs of the plurality of second multiplexers 442a, 442b, 442c, and 442d. The second slicer 431b may generate a second bit SDS22 of the sampled signal SDS2 by sampling the second compensated data signal CDS22 based on the second divided strobe signal DQS_2N_90.

The third summer 421c may generate a third compensated data signal CDS23 by summing the internal data signal IDS23 and a third feedback signal corresponding to outputs of the plurality of third multiplexers 443a, 443b, 443c, and 443d. The third slicer 431c may generate a third bit SDS23 of the sampled signal SDS2 by sampling the third compensated data signal CDS23 based on the third divided strobe signal DQS_2N_180.

The fourth summer 421d may generate a fourth compensated data signal CDS24 by summing the internal data signal IDS24 and a fourth feedback signal corresponding to outputs of the plurality of fourth multiplexers 444a, 444b, 444c, and 444d. The fourth slicer 431d may generate a fourth bit SDS24 of the sampled signal SDS2 by sampling the fourth compensated data signal CDS24 based on the fourth divided strobe signal DQS_2N_270.

Each of the plurality of first multiplexers 441a, 441b, 441c, and 441d may provide the first summer 421a with one of each of bits SDS21, SDS22, SDS23, and SDS24 of the sampled signal SDS2 and a first logic level based on the power supply voltage VDDQ as the first feedback signal based on respective one of the sub reset control signals RCS14, RCS13, RCS12, and RCS11.

Each of the plurality of second multiplexers 442a, 442b, 442c, and 442d may provide the second summer 421b with one of each of bits SDS22, SDS23, SDS24, and SDS21 of the sampled signal SDS2 and a first logic level based on the power supply voltage VDDQ as the second feedback signal based on respective one of the sub reset control signals RCS14, RCS13, RCS12 and RCS11.

Each of the plurality of third multiplexers 443a, 443b, 443c and 443d may provide the third summer 421c with one of each of bits SDS23, SDS24, SDS21, and SDS22 of the sampled signal SDS2 and a first logic level based on the power supply voltage VDDQ as the third feedback signal based on respective one of the sub reset control signals RCS14, RCS13, RCS12, and RCS11.

Each of the plurality of fourth multiplexers 444a, 444b, 444c, and 444d may provide the fourth summer 421d with one of each of bits SDS24, SDS21, SDS22, and SDS23 of the sampled signal SDS2 and a first logic level based on the power supply voltage VDDQ as the third feedback signal based on respective one of the sub reset control signals RCS14, RCS13, RCS12 and RCS11.

The plurality of second multiplexers 442a, 442b, 442c, and 442d, the plurality of second multiplexers 442a, 442b, 442c, and 442d, the plurality of third multiplexers 443a, 443b, 443c, and 443d and the plurality of fourth multiplexers 444a, 444b, 444c, and 444d may select different one of the its SDS21, SDS22, SDS23, and SDS24 of the sampled signal SDS2 at the same time point in the first operation mode based on the sub reset control signals RCS14, RCS13, RCS12, and RCS11.

Therefore, the decision feedback equalizer 420b may provide the first through fourth feedback signals by interleaving the bits SDS21, SDS22, SDS23, and SDS24 of the sampled signal SDS2 in parallel in a first operation mode in which the write operation is performed on the data signal DS and may reset the first through fourth feedback signals with the first logic level in a second operation mode in which the write operation is not performed on the data signal DS, based on the first through fourth divided strobe signals first through fourth divided strobe signals DQS_2N_0, DQS_2N_90, DQS_2N_180, and DQS_2N_270 and the plurality of sub reset control signals RCS11, RCS12, RCS13, and RCS14.

Figure 17:
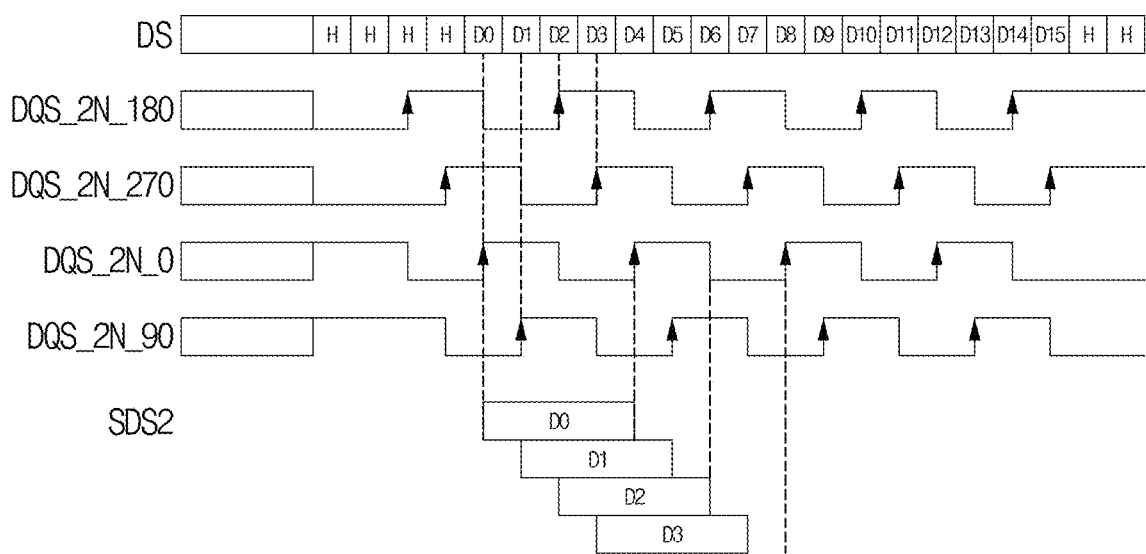
FIG. 17 is a timing diagram illustrating an operation of the decision feedback equalizer of FIG. 16 according to various example embodiments.

FIG. 17 is a timing diagram illustrating an operation of the decision feedback equalizer of FIG. 16 according to various example embodiments.

Referring to FIGS. 16 and 17, when the data signal DS is normally received, the first bit D0 is sampled based on a rising edge of the first divided strobe signal DQS_2N_0, the first bit D1 is sampled based on a rising edge of the second divided strobe signal DQS_2N_90, the third bit D2 is sampled based on a rising edge of the third divided strobe signal DQS_2N_180 and the fourth bit D3 is sampled based on a rising edge of the fourth divided strobe signal DQS_2N_270, and thus, the decision feedback equalizer 420b provides the sampled signal SDS2 including the bits D0, D1, D2, and D3.

Figure 18:
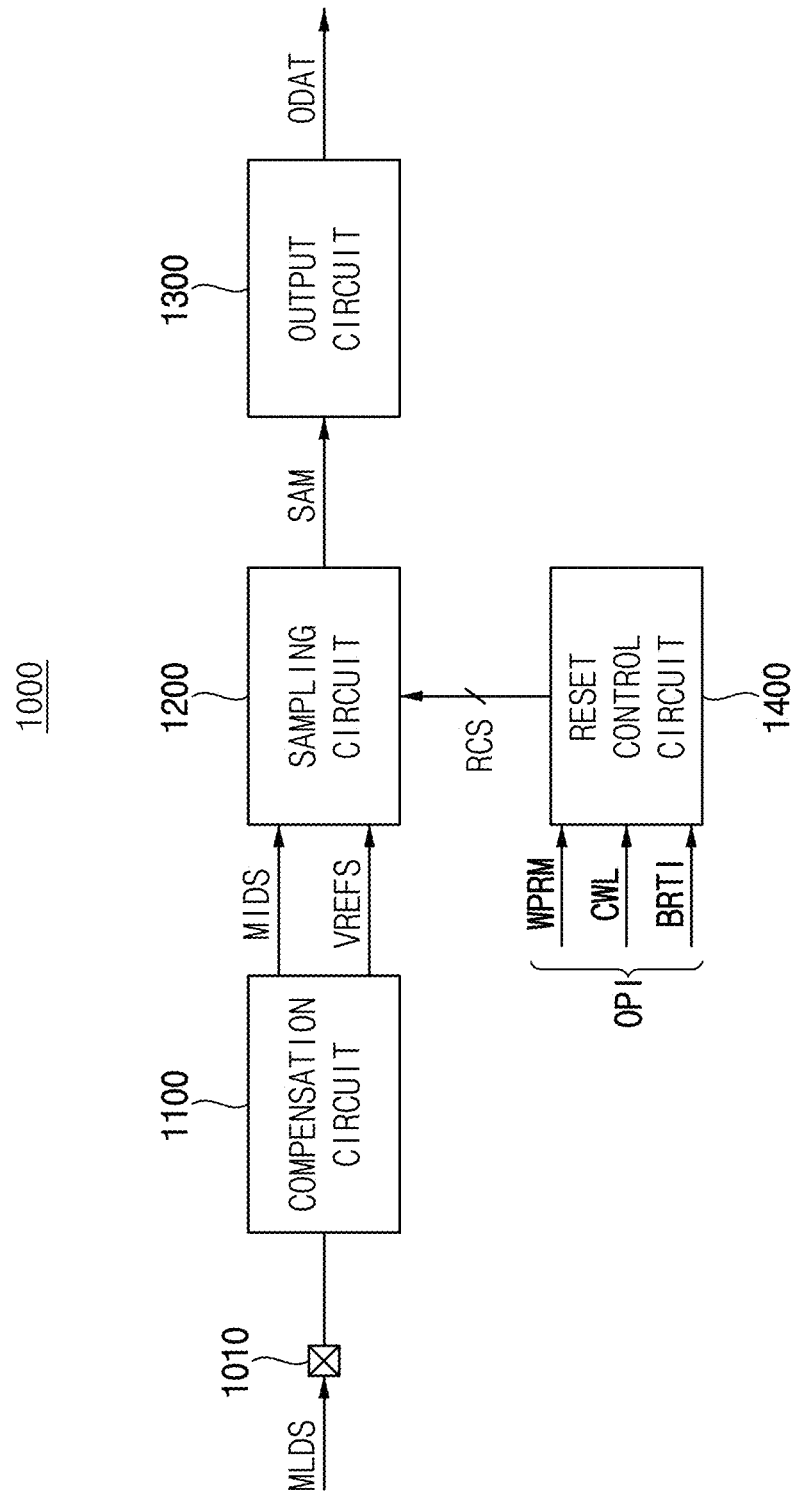
FIG. 18 is a block diagram illustrating a receiver according to various example embodiments.

FIG. 18 is a block diagram illustrating a receiver according to various example embodiments.

Referring to FIG. 18, a receiver 1000 may include a compensation circuit 1100, a sampling circuit 1200, an output circuit 1300 and a reset control circuit 1400. The receiver 1000 may further include a data input pad (or pin) 1010.

The receiver 1000 may receive a data signal MDS that is a multi-level signal having three or more voltage levels, and generates output data ODAT that is multi-bit data including two or more bits based on the data signal MDS. For example, the multi-level signal may have one of three or more voltage levels that are different from each other during one unit interval (UI), and the multi-bit data may include two or more bits that are different from each other. The receiver 1000 may be included in various communication systems and/or signal transmission systems, and may be included in, for example, a semiconductor memory device and/or a memory system.

The compensation circuit 1100 may generate a plurality of data signals (or intermediate data signals) MIDS and a plurality of reference voltages VREFS by compensating inter-symbol interference (ISI) on the data signal MDS that is the multi-level signal. Each of the plurality of reference voltages VREFS includes a plurality of compensation reference levels.

The sampling circuit 1200 may generate a plurality of sample signals SAM based on the plurality of data signals MIDS and the plurality of reference voltages VREFS. Each of the plurality of sample signals SAM includes a plurality of decision values.

In some example embodiments, the compensation circuit 1100 and the sampling circuit 1200 may form a decision feedback equalizer (DFE), and may be implemented in a loop-unrolling structure. Detailed configurations of the compensation circuit 1100 and the sampling circuit 1200 will be described with reference to FIG. 20.

In some example embodiments, the compensation circuit 1100 may generate the plurality of compensation reference levels by performing an equalization (or equalizing) technique on a plurality of reference levels. For example, the compensation circuit 1100 may perform a post-cursor cancellation based on a decision feedback equalization, and may be referred to as a post-cursor cancellation circuit. The plurality of reference levels may be used to sense or detect voltage levels of the multi-level signal. When the equalization is performed on the plurality of reference levels, the plurality of compensation reference levels may be generated by adjusting or controlling increasing and/or decreasing directions for the plurality of reference levels and the amount of change in the plurality of reference levels. For example, the sampling circuit 1200 may perform a decision (or determination) based on an output of the compensation circuit 1100, and may be referred to as a decision circuit or a slicer circuit.

The output circuit 1300 may generate the output data ODAT that is the multi-bit data based on the plurality of sample signals SAM, and may select a current value of the output data ODAT based on a previous value of the output data ODAT. For example, the output circuit 1300 may be used to decide or determine an output in the loop-unrolling structure. A detailed configuration of the output circuit 1300 will be described with reference to FIG. 22.

The reset control circuit 1400 may generate a reset control signal RCS based on operating information OPI associated with the write operation of the data signal MDS and may provide the reset control signal RCS to the sampling circuit 1200.

The operating information OPI may include a write preamble WPRM associated with starting of the write operation, a time information CWL corresponding to a time interval from a time point at which a previous write operation is performed to a time point at which a successive write operation is to be performed and a burst information BRTI associated with a burst operation of the write operation. The time information CWL may correspond to a column address strobe (CAS) write latency.

The reset control circuit 1400 may output the reset control signal RCS with a second logic level in the first operation mode in which the write operation is performed on the data signal MDS and may output the reset control signal RCS with a first logic level in the second operation mode in which the write operation is not performed on the data signal MDS based on the operating information OPI including the write preamble WPRM, the burst information BRTI and the time information CWL.

The data input pad 1010 may be connected to the compensation circuit 1100, and may receive the data signal MDS. For example, a pad may be a contact pad or a contact pin, but example embodiments are not limited thereto.

The data signal MDS is received based on a multi-level signaling scheme. The multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed.

For example, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be $2^2$ possible discrete pulse amplitudes in a 4-level PAM (e.g., in PAM4), there may be $2^3$ possible discrete pulse amplitudes in an 8-level PAM (e.g., in PAM8), and there may be $2^4$ possible discrete pulse amplitudes in a 16-level PAM (e.g., in PAM16). However, example embodiments are not limited thereto, and example embodiments may be applied or employed to a K-level PAM (e.g., PAM (K)) having K possible pulse amplitudes, where K is a natural number greater than or equal to three.

In a general data I/O interface, a data signal is transmitted to a receiver through a channel. Recently, as the data rate increases, interference signals due to the channel influence may increase, and thus the characteristic and/or quality of a received signal may be degraded or deteriorated. To solve this problem or improve signal integrity (SI), the equalization (or equalizing) technique has been used to restore or recover the received signal by canceling or compensating the interference signals. One of various equalization techniques is the decision feedback equalization. In the decision feedback equalization, the signal integrity may be improved by canceling the interference signals (e.g., by canceling post-cursors that cause the inter-symbol interference), however, there may be a feedback delay because current data is compensated after determining the amount of signal compensation depending on a result of deciding previous data. To reduce the feedback delay, the decision feedback equalization with the loop-unrolling structure has been researched. In the loop-unrolling structure, output candidates may be generated by pre-calculating compensation signals based on all possible results of decision values, and then one of the output candidates may be selected as a final output value.

Figure 19A:
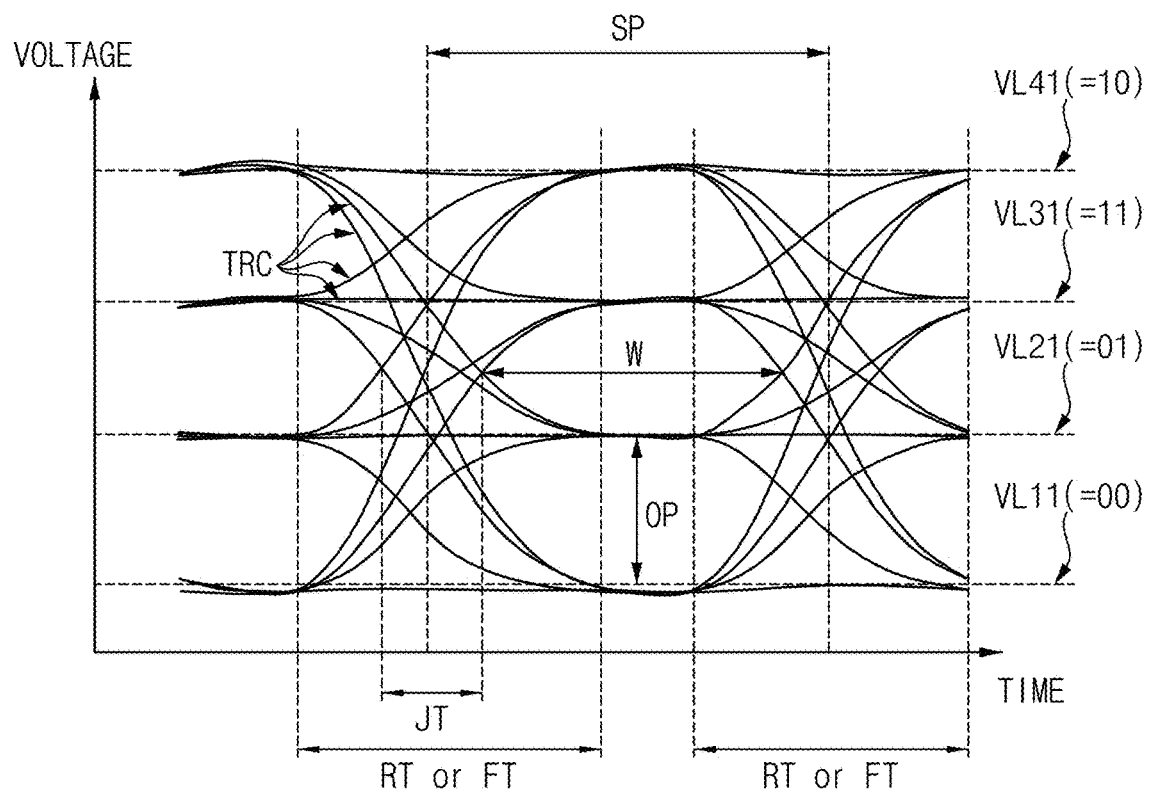
FIGS. 19A and 19B are diagrams for describing a data signal that is generated based on multi-level signaling scheme according to various example embodiments.
Figure 19B:
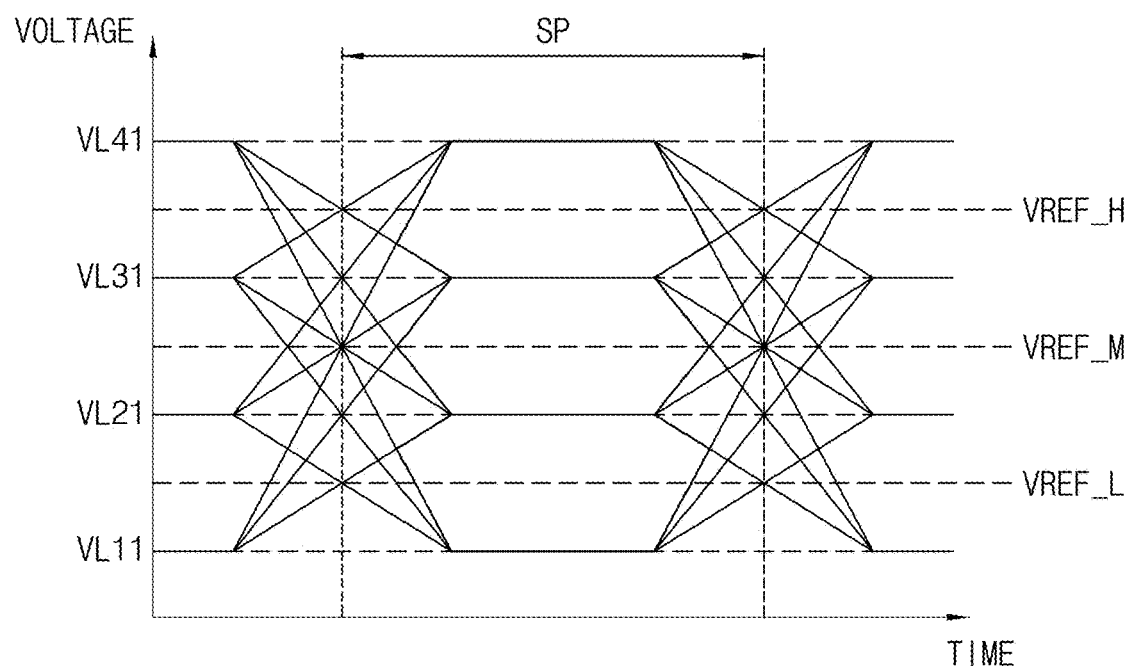

FIGS. 19A and 19B are diagrams for describing a data signal that is generated based on multi-level signaling scheme according to various example embodiments.

FIG. 19A illustrates an ideal eye diagram of a data signal (e.g., a PAM4 signal) generated based on the 4-level scheme (e.g., the PAM4 scheme) that is an example of the multi-level signaling scheme (e.g., the PAM scheme). FIG. 19B is a diagram illustrated by simplifying the ideal eye diagram of FIG. 19A.

Referring to FIG. 19A, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. The eye diagram may be used to provide a visual indication of the health of the signal integrity, and may indicate noise margins of the data signal. For example, when a Gray code is used, the voltage levels VL11, VL21, VL31 and VL41 may be mapped to '00', '01', '11', and '10', respectively.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SP to form the plurality of traces TRC. Various characteristics associated with the measured signal may be determined by overlaying the plurality of traces TRC.

The eye diagram may be used to identify a number of characteristics of a communication signal such as jitter, cross talk, electromagnetic interference (EMI), signal loss, signal-to-noise ratio (SNR), other characteristics, or combinations thereof. For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL21, VL31, and VL41. The eye opening OP may be related to a voltage margin for discriminating between different voltage levels VL11, VL21, VL31, and VL41 of the measured signal. For example, the eye diagram may be used to identify a rise time RT and/or a fall time FT for transitions from a first amplitude to a second amplitude. The rise time RT or the fall time FT may indicate a time required for transitioning from one voltage level to another voltage level, may be related to or associated with a rising edge and a falling edge, respectively. For example, the eye diagram may be used to identify an amount of jitter JT in the measured signal. The jitter JT may refer to a timing error that results from a misalignment of rise and fall times.

Referring to FIG. 19B, different first, second, third and fourth voltage levels VL11, VL21, VL31, and VL41 of the data signal that is the PAM4 signal are illustrated, and different first, second and third reference levels VREF_H, VREF_M, and VREF_L for sensing or detecting the level of the data signal are illustrated. For example, the number of the reference levels may be less than the number of the voltage levels of the data signal by one.

The first voltage level VL11 that is the lowest voltage level among the voltage levels VL11~VL41 may be lower than the second voltage level VL21, the second voltage level VL21 may be lower than the third voltage level VL31, and the third voltage level VL31 may be lower than the fourth voltage level VL41 that is the highest voltage level among the voltage levels VL11~VL41. In addition, the first reference level VREF_H may be a level between the third and fourth voltage levels VL31 and VL41, the second reference level VREF_M may be a level between the second and third voltage levels VL21 and VL31, and the third reference level VREF_L may be a level between the first and second voltage levels VL11 and VL21. The voltage level (e.g., the symbol) of the data signal may be decided or determined based on a result of comparing the data signal with the reference levels VREF_H, VREF_M and VREF_L.

Figure 20:
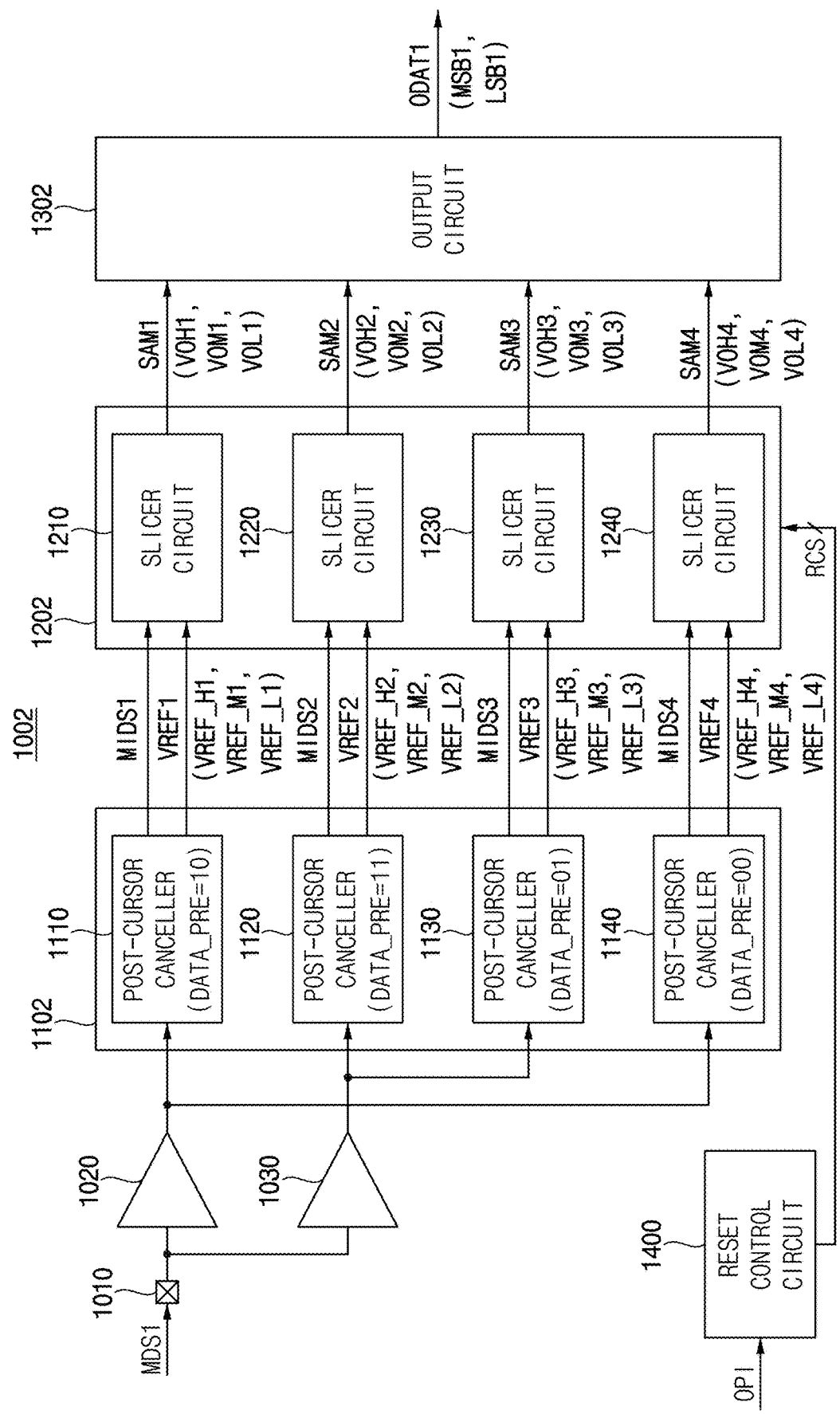
FIG. 20 is a block diagram illustrating an example of the receiver of FIG. 18 according to various example embodiments.

FIG. 20 is a block diagram illustrating an example of the receiver of FIG. 18 according to various example embodiments.

Referring to FIG. 20, a receiver 1002 may include a compensation circuit 1102, a sampling circuit 1202, an output circuit 1302 and a reset control circuit 1400. The receiver 1002 may further include a data input pad 1010, a first buffer 1020 and a second buffer 1030.

The data input pad 1010 may receive a data signal MDS1 having one of the first, second, third, and fourth voltage levels VL11, VL21, VL31, and VL41 during one UI.

The compensation circuit 1102 may include a first post-cursor canceller 1110, a second post-cursor canceller 1120, a third post-cursor canceller 1130 and a fourth post-cursor canceller 1140.

The first post-cursor canceller 1110 may generate a first data signal MIDS1 and a first reference voltage VREF1 based on when a previous value DATA_PRE of output data ODAT1 is '10' (e.g., corresponds to the fourth voltage level VL41). The second post-cursor canceller 1120 may generate a second data signal MIDS2 and a second reference voltage VREF2 based on when the previous value DATA_PRE of the output data ODAT1 is '11' (e.g., corresponds to the third voltage level VL31). The third post-cursor canceller 1130 may generate a third data signal MIDS3 and a third reference voltage VREF3 based on when the previous value DATA_PRE of the output data ODAT1 is '01' (e.g., corresponds to the second voltage level VL21). The fourth post-cursor canceller 1140 may generate a fourth data signal MIDS4 and a fourth reference voltage VREF4 based on when the previous value DATA_PRE of the output data ODAT1 is '00' (e.g., corresponds to the first voltage level VL11). For example, each post-cursor canceller may include a feedback filter having an n-tap structure, where n is a natural number.

The first reference voltage VREF1 may include first, second and third compensation reference levels VREF_H1, VREF_M1, and VREF_L1. The second reference voltage VREF2 may include fourth, fifth, and sixth compensation reference levels VREF_H2, VREF_M2, and VREF_L2. The third reference voltage VREF3 may include seventh, eighth and ninth compensation reference levels VREF_H3, VREF_M3 and VREF_L3. The fourth reference voltage VREF4 may include tenth, eleventh, and twelfth compensation reference levels VREF_H4, VREF_M4, and VREF_L4. Each of the first, fourth, seventh, and tenth compensation reference levels VREF_H1, VREF_H2, VREF_H3, and VREF_H4 may correspond to the first reference level VREF_H, and may be generated by increasing or decreasing the first reference level VREF_H by a specific level based on the equalization. Similarly, each of the second, fifth, eighth, and eleventh compensation reference levels VREF_M1, VREF_M2, VREF_M3, and VREF_M4 may correspond to the second reference level VREF_M, and may be generated by increasing or decreasing the second reference level VREF_M by a specific level based on the equalization. Each of the third, sixth, ninth, and twelfth compensation reference levels VREF_L1, VREF_L2, VREF_L3, and VREF_L4 may correspond to the third reference level VREF_L, and may be generated by increasing or decreasing the third reference level VREF_L by a specific level based on the equalization.

In some example embodiments, the data signals MIDS1 to MIDS4 may be substantially the same as each other. In other example embodiments, the first data signal MIDS1 and the first reference voltage VREF1 may be provided as a pair of differential signals, another data signal and a corresponding reference voltage may also be provided as a pair of differential signals, and thus the data signals MIDS1 to MIDS4 may be different from each other.

The sampling circuit 1202 may include a first slicer circuit 1210, a second slicer circuit 1220, a third slicer 1230 and a fourth slicer circuit 1240.

The first slicer circuit 1210 may generate a first sample signal SAM1 by comparing the first data signal MIDS1 with the first, second and third compensation reference levels VREF_H1, VREF_M1, and VREF_L1. The second slicer circuit 1220 may generate a second sample signal SAM2 by comparing the second data signal MIDS2 with the fourth, fifth and sixth compensation reference levels VREF_H2, VREF_M2, and VREF_L2. The third slicer circuit 1230 may generate a third sample signal SAM3 by comparing the third data signal MIDS3 with the seventh, eighth and ninth compensation reference levels VREF_H3, VREF_M3, and VREF_L3. The fourth slicer circuit 1240 may generate a fourth sample signal SAM4 by comparing the fourth data signal MIDS4 with the tenth, eleventh and twelfth compensation reference levels VREF_H4, VREF_M4, and VREF_L4. For example, as will be described with reference to FIG. 21, each slicer circuit may include a plurality of comparators.

The first sample signal SAM1 may include first, second and third decision values VOH1, VOM1 and VOL1. The second sample signal SAM2 may include fourth, fifth and sixth decision values VOH2, VOM2, and VOL2. The third sample signal SAM3 may include seventh, eighth, and ninth decision values VOH3, VOM3, and VOL3. The fourth sample signal SAM4 may include tenth, eleventh and twelfth decision values VOH4, VOM4, and VOL4. Each of the first, fourth, seventh and tenth decision values VOH1, VOH2, VOH3, and VOH4 may represent a decision result obtained by comparing the data signal MDS1 with a respective one of the first reference levels equalized by the compensation circuit 1102. Similarly, each of the second, fifth, eighth and eleventh decision values VOM1, VOM2, VOM3, and VOM4 may represent a decision result obtained by comparing the data signal MDS1 with a respective one of the second reference levels equalized by the compensation circuit 1102. Each of the third, sixth, ninth, and twelfth decision values VOL1, VOL2, VOL3, and VOL4 may represent a decision result obtained by comparing the data signal MDS1 with a respective one of the third reference levels equalized by the compensation circuit 1102.

The output circuit 1302 may generate the output data ODAT1 including a first bit MSB1 and a second bit LSB1 based on the first through twelfth decision values VOH1~VOH4, VOM1~VOM4 and VOL1~VOL4. The first and second bits MSB1 and LSB1 may be a most significant bit (MSB) and a least significant bit (LSB) of the output data ODAT1, respectively. For example, when the output data ODAT1 is '10', the first bit MSB1 may be '1', and the second bit LSB1 may be '0'.

The first buffer 1020 may buffer the data signal MDS1 and may provide the buffered data signal to the first and fourth post-cursor cancellers 1110 and 1140. The second buffer 1030 may buffer the data signal MDS1 and may provide the buffered data signal to the second and third post-cursor cancellers 1120 and 1130.

The reset control circuit 1400 may generate the reset control signal RCS based on the operating information OPI associated with the write operation of the data signal MDS and may provide the reset control signal RCS to the sampling circuit 1202.

As described above, the receiver 1002 may be implemented in the loop-unrolling structure such that the compensation circuit 1102 and the sampling circuit 1202 precalculate all possible decision results and generate output candidates based thereon and the output circuit 1302 selects one of the output candidates as a final output value.

In some example embodiments, as will be described with reference to FIG. 22, the output circuit 1302 may select or determine an output value of the loop-unrolling structure based on the first and second bits MSB1 and LSB1. In this example, the number of multiplexers and flip-flops may be reduced, and a load at an input-end viewed through the buffer may be reduced.

Figure 21:
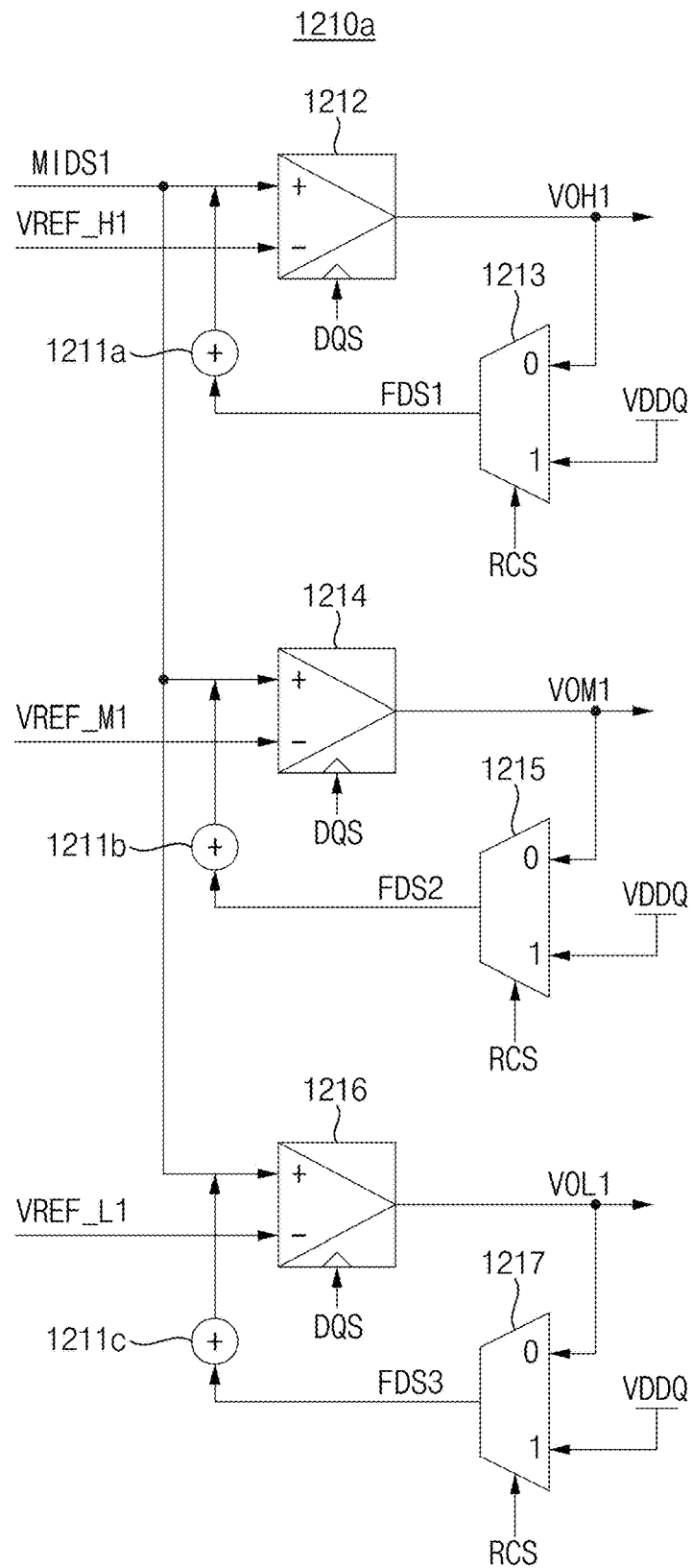
FIG. 21 is a block diagram illustrating an example of the first slicer circuit in the receiver of FIG. 20 according to various example embodiments.

FIG. 21 is a block diagram illustrating an example of the first slicer circuit in the receiver of FIG. 20 according to various example embodiments.

Referring to FIG. 21, a first slicer circuit 1210a may include comparators 1212, 1214, and 1216 each of which operates based on a data strobe signal DQS and summers 1211a, 1211b, and 1211c and multiplexers 1213, 1215, and 1217.

The comparator 1212 may generate the first decision value VOH1 by comparing the first data signal MIDS1 with the first compensation reference level VREF_H1. The multiplexer 1213 may provide one of the first decision value VOH1 and a first logic level based on the power supply voltage VDDQ as a first feedback signal FS1 based on the reset control signal RCS. The summer 1211a may sum the first data signal MIDS1 and the first feedback signal FS1, and may provide a summed result to the comparator 1212.

The comparator 1214 may generate the second decision value VOM1 by comparing the first data signal IDS1 with the second compensation reference level VREF_M1. The multiplexer 1215 may provide one of the second decision value VOM1 and a first logic level based on the power supply voltage VDDQ as a second feedback signal FS2 based on the reset control signal RCS. The summer 1211b may sum the second data signal MIDS2 and the second feedback signal FS2, and may provide a summed result to the comparator 1214.

The comparator 1216 may generate the third decision value VOL1 by comparing the first data signal IDS1 with the third compensation reference level VREF_L1. The multiplexer 1217 may provide one of the third decision value VOL1 and a first logic level based on the power supply voltage VDDQ as a third feedback signal FS3 based on the reset control signal RCS. The summer 1211c may sum the second data signal MIDS3 and the third feedback signal FS3 and may provide a summed result to the comparator 1216.

Each of the remaining slicer circuits 1220, 1230 and 1240 may have a structure substantially the same as that of the first slicer circuit 1210a.

Figure 22:
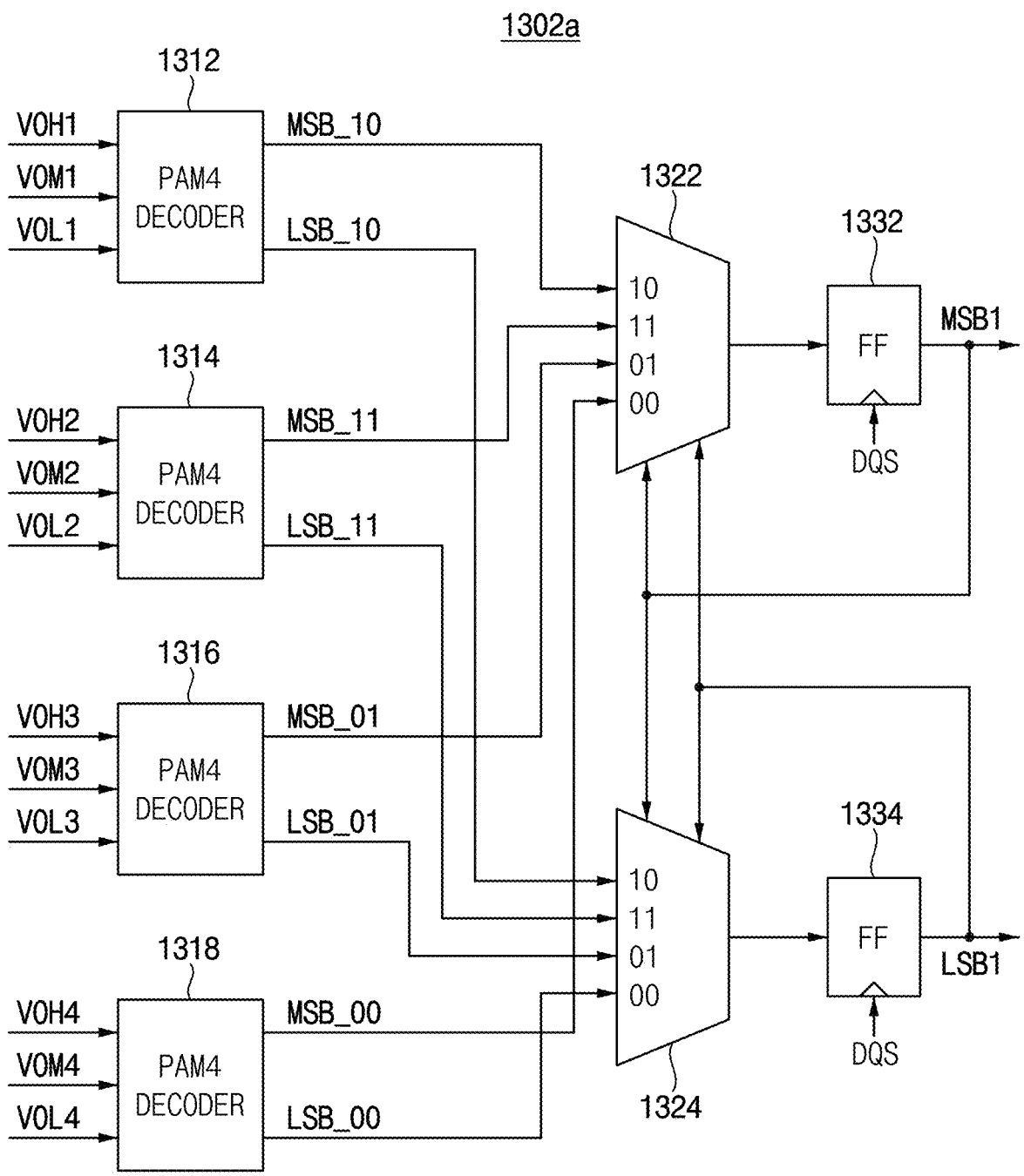
FIG. 22 is a block diagram illustrating an example of the output circuit in the receiver of FIG. 20 according to various example embodiments.

FIG. 22 is a block diagram illustrating an example of the output circuit in the receiver of FIG. 20 according to various example embodiments.

Referring to FIG. 22, an output circuit 1302a may include a first decoder 1312, a second decoder 1314, a third decoder 1316, a fourth decoder 1318, a first multiplexer 1322 and a second multiplexer 1324. The output circuit 1302a may further include flip-flops (FF) 1332 and 1334 each of which operates based on the data strobe signal DQS.

The first decoder 1312 may generate a first MSB MSB_10 and a first LSB LSB_10 based on the first, second and third decision values VOH1, VOM1 and VOL1. The second decoder 1314 may generate a second MSB MSB_11 and a second LSB LSB_11 based on the fourth, fifth and sixth decision values VOH2, VOM2 and VOL2. The third decoder 1316 may generate a third MSB MSB_01 and a third LSB LSB_01 based on the seventh, eighth and ninth decision values VOH3, VOM3 and VOL3. The fourth decoder 1318 may generate a fourth MSB MSB_00 and a first LSB LSB_00 based on the tenth, eleventh, and twelfth decision values VOH4, VOM4 and VOL4.

The first multiplexer 1322 may output the first bit (e.g., MSB) MSB1 of the output data ODAT1 by selecting one of the first, second, third and fourth MSBs MSB_10, MSB_11, MSB_01 and MSB_00. The second multiplexer 1324 may output the second bit (e.g., LSB) LSB1 of the output data ODAT1 by selecting one of the first, second, third and fourth LSBs LSB_10, LSB_11, LSB_01 and LSB_00. The first and second bits MSB1 and LSB1 of the output data ODAT1 may be synchronized with the data strobe signal DQS by the flip-flops 1332 and 1334.

Figure 23:
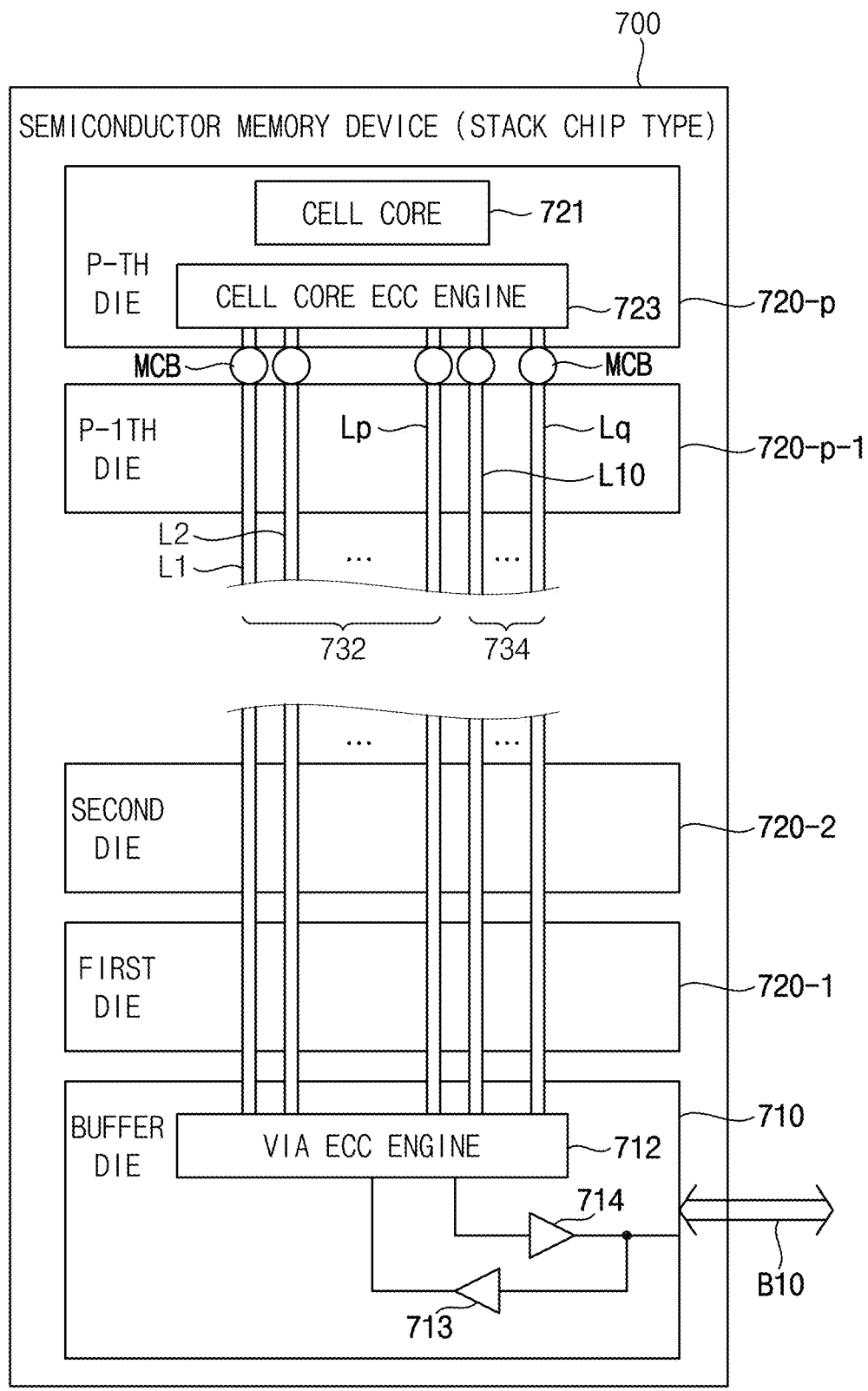
FIG. 23 is a block diagram illustrating a semiconductor memory device according to various example embodiments.

FIG. 23 is a block diagram illustrating a semiconductor memory device according to various example embodiments.

Referring to FIG. 23, a semiconductor memory device 700 may include at least one buffer die 710 and a plurality of memory dies 720-1 to 720-p (p is a natural number equal to or greater than three) providing a soft error analyzing and correcting function in a stacked chip structure.

The plurality of memory dies 720-1 to 720-p are stacked on the buffer die 710 and conveys data through a plurality of through silicon via (TSV) lines.

At least one of the memory dies 720-1 to 720-p may include a cell core 721 to store data and a cell core ECC engine 722 which generates transmission parity bits (e.g., transmission parity data) based on transmission data to be sent to the at least one buffer die 710. The cell core 721 may include a plurality of memory cells having DRAM cell structure.

The buffer die 711 may include a via ECC engine 712 which corrects a transmission error using the transmission parity bits when a transmission error is detected from the transmission data received through the TSV liens and generates error-corrected data.

The buffer die 711 may further include a receiver 713 and a transmitter 714. The receiver 713 may employ the receiver 400 of FIG. 7.

The semiconductor memory device 700 may be a stack chip type memory device or a stacked memory device which conveys data and control signals through the TSV lines. The TSV lines may be also called 'through electrodes'.

The cell core ECC engine 722 may perform error correction on data which is outputted from the memory die 720-$p$ before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 732 which is formed at one memory die 720-$p$ may include TSV lines L1, L2 to Lp, and a parity TSV line group 734 may include TSV lines L10 to Lq.

The TSV lines L1, L2 to Lp of the data TSV line group 732 and the parity TSV lines L10 to Lq of the parity TSV line group 734 may be connected to micro bumps MCB which are correspondingly formed among the memory dies 720-1 to 720-$p$.

At least one of the memory dies 720-1 to 720-$p$ may include DRAM cells each including at least one access transistor and one storage capacitor.

The semiconductor memory device 700 may have a three-dimensional (3D) chip structure or a 2.5D chip structure to communicate with the host through a data bus B10. The buffer die 710 may be connected with the memory controller through the data bus B10.

The cell core ECC engine 722 may output transmission parity bits as well as the transmission data through the parity TSV line group 734 and the data TSV line group 732 respectively. The outputted transmission data may be data which is error-corrected by the cell core ECC engine 722.

The via ECC engine 712 may determine whether a transmission error occurs at the transmission data received through the data TSV line group 732, based on the transmission parity bits received through the parity TSV line group 734. When a transmission error is detected, the via ECC engine 712 may correct the transmission error on the transmission data using the transmission parity bits. When the transmission error is uncorrectable, the via ECC engine 712 may output information indicating occurrence of an uncorrectable data error.

Figure 24:
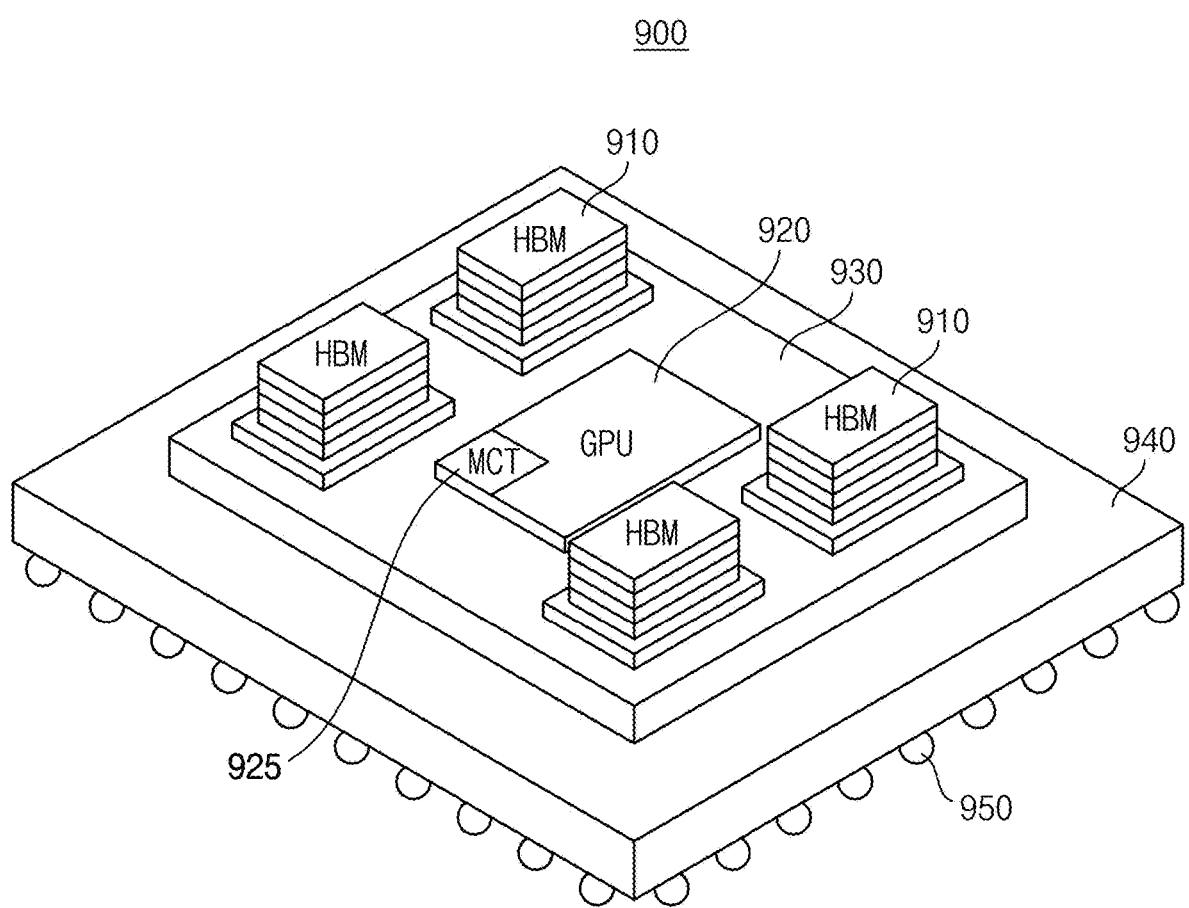
FIG. 24 is a configuration diagram illustrating a semiconductor package including the stacked memory device according to various example embodiments.

FIG. 24 is a configuration diagram illustrating a semiconductor package including the stacked memory device according to various example embodiments.

Referring to FIG. 24, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted, for example, on solder balls 950. The GPU 920 may correspond to a semiconductor device which may perform a memory control function, and for example, the GPU 920 may be implemented as an application processor (AP). The GPU 920 may include a memory controller MCT 925.

The stacked memory device 910 may be implemented in various forms, and the stacked memory device 910 may be a memory device in a high bandwidth memory (HBM) form in which a plurality of layers are stacked. The number of and/or the arrangement of the HBM memory devices 910 may be varied according to various example embodiments. Accordingly, the stacked memory device 910 may include a buffer die and a plurality of memory dies and the buffer die may include an above-mentioned receiver.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Figure 25:
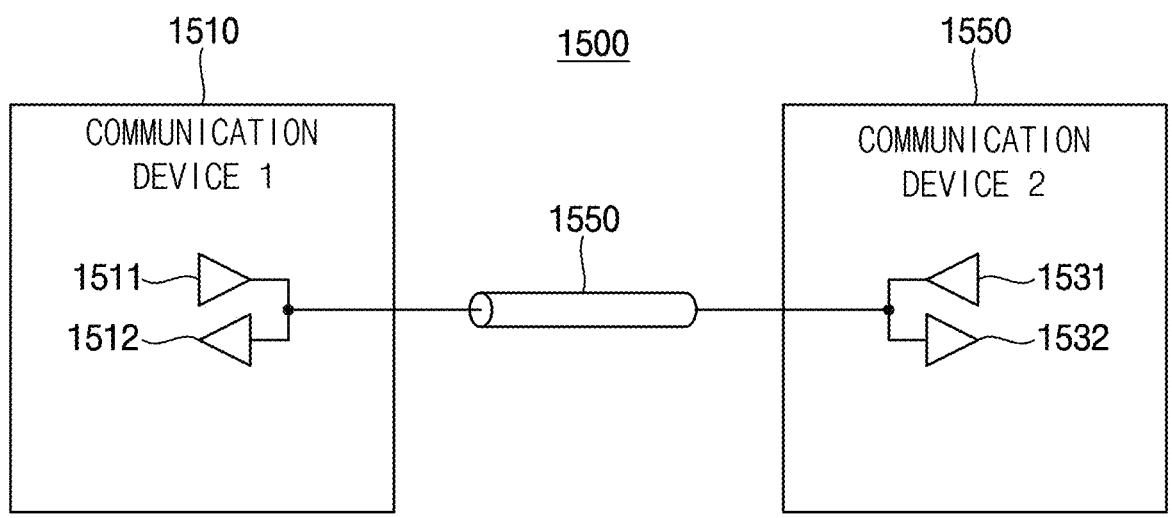
FIG. 25 is a block diagram illustrating a communication system according to various example embodiments.

FIG. 25 is a block diagram illustrating a communication system according to various example embodiments.

Referring to FIG. 25, a communication system 1500 includes a first communication device 1510, a second communication device 1530 and a channel 1050.

The first communication device 1510 includes a first transmitter 1511 and a first receiver 1512. The second communication device 1530 includes a second transmitter 1531 and a second receiver 1532. The first transmitter 1511 and the first receiver 1512 are connected to the second transmitter 1531 and the second receiver 1532 through the channel 1550. In some example embodiments, each of the first and second communication devices 1510 and 1530 may include a plurality of transmitters and a plurality of receivers, and the communication system 1500 may include a plurality of channels for connecting the plurality of transmitters and a plurality of receivers.

The receivers 1512 and 1532 may be or may correspond to, or include or be included in, the receiver according to various example embodiments, may provide the sampled signal as the feedback signal in the first operation mode in which a write operation is performed on the data signal and may reset the feedback signal with a first logic level based on the power supply voltage in the second operation mode in which the write operation is not performed on the data signal.

Inventive concepts may be applied to various devices and systems that include the memory devices and the memory systems. For example, inventive concepts may be applied to systems such as one or more of a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Any of the elements and/or functional blocks disclosed above may include or be implemented in processing circuitry such as hardware including logic circuits; a hardware/ software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Furthermore, example embodiments are not necessarily mutually exclusive with one another. For example, some example embodiments may include one or more features described with reference to one or more figures, and may also include one or more other features described with reference to one or more other figures.

What is claimed is:

1. A receiver comprising:
   a buffer configured to generate an internal data signal by comparing a received data signal with a reference voltage;
   a decision feedback equalizer configured to generate a sampled signal based on a present value of the internal data signal and on a feedback signal, and configured to provide the sampled signal or a first logic level as the feedback signal based on a reset control signal, the sampled signal corresponding to a previous value of the internal data signal;
   a deserializer configured to generate an output data by deserializing the sampled signal; and
   a reset control circuit configured to generate the reset control signal based on operating information associated with a write operation of the data signal and configured to provide the reset control signal to the decision feedback equalizer.

2. The receiver of claim 1, wherein
   in response to the reset control signal, the decision feedback equalizer is configured to:
   update the feedback signal with the sampled signal in a first operation mode in which the write operation is performed on the data signal; and
   reset the feedback signal with the first logic level in a second operation mode in which the write operation is not performed on the data signal.

3. The receiver of claim 1, wherein the decision feedback equalizer includes:
   a summer configured to generate a compensated data signal by summing the internal data signal and the feedback signal;
   a slicer configured to output the sampled signal by sampling the compensated data signal based on a data strobe signal; and
   a selection circuit configured to provide one of the sampled signal or the first logic level as the feedback signal based on the reset control signal.

4. The receiver of claim 3, wherein the selection circuit includes a multiplexer, and
   the multiplexer includes:
   a first input terminal configured to receive the sampled signal;
   a second input terminal configured to be connected to a power supply voltage;
   a control terminal configured to receive the reset control signal; and
   an output terminal configured to provide the feedback signal.

5. The receiver of claim 1, wherein
   the operating information includes a write preamble associated with starting of the write operation, a time information corresponding to a time interval from a time point at which a previous write operation is performed to a time point at which a successive write operation is to be performed, and a burst information associated with a burst operation of the write operation, and
   the reset control circuit includes,
   a burst end signal generator configured to generate a first internal burst end signal indicating a completion of the write operation based on the write preamble, the time information, and the burst information;
   a flipflop configured to generate a second internal burst end signal by delaying the first internal burst end signal based on a data strobe signal;
   a pulse generator configured to generate a burst end signal having a first activation interval based on the second internal burst end signal; and
   a reset control signal generator configured to generate a plurality of sub reset control signals of the reset control signal based on the burst end signal and the data strobe signal.

6. The receiver of claim 5, wherein
   the burst information includes a burst length information associated with a burst length indicating a number of data bits which are inputted successively in the write operation that is performed based on one write command, and a burst chop information indicating a number of data bits which are not used in the burst length, and
   the burst end signal generator includes,
   a first sub circuit configured to generate a plurality of sub time information having regular time interval based on the time information and a clock signal; and
   a second sub circuit configured to generate the first internal burst end signal based on the time information, the plurality of sub time information, the write preamble, and the clock signal.

7. The receiver of claim 5, wherein the pulse generator includes:
   an odd number of cascade-connected inverters configured to generate an inverted second internal burst end signal by sequentially inverting the second internal burst end signal; and
   an AND gate configured to output the burst end signal by performing an AND operation on the second internal burst end signal and the inverted second internal burst end signal.

8. The receiver of claim 7, wherein the first activation interval corresponds to delay time intervals of the odd number of inverters.

9. The receiver of claim 5, wherein the flipflop is configured to latch the first internal burst end signal based on a falling edge of the data strobe signal.

10. The receiver of claim 5, wherein the reset control signal generator includes:
  a plurality of cascade-connected first D-flipflops configured to generate a first sub reset control signal and a third sub reset control signal from among the plurality of sub reset control signals by sequentially delaying the burst end signal based on a rising edge of the data strobe signal; and
  a plurality of cascade-connected second D-flipflops, configured to generate a second sub reset control signal and a fourth sub reset control signal from among the plurality of sub reset control signals by sequentially delaying the burst end signal in parallel with the plurality of first D-flipflops, based on a falling edge of the data strobe signal.

11. The receiver of claim 10, wherein
the data strobe signal includes a first strobe signal and a second strobe signal that have a phase difference of 180 degrees with respect to each other, and
the decision feedback equalizer is configured to,
  provide a first feedback signal by interleaving even bits of the sampled signal and provide a second feedback signal by interleaving odd bits of the sampled signal, the first feedback signal and the second feedback signal provided based on the first strobe signal, the second strobe signal, and a plurality of sub reset control signals of the reset control signal in a first operation mode in which the write operation is performed on the data signal; and
  reset the first feedback signal and the second feedback signal with the first logic level in a second operation mode in which the write operation is not performed on the data signal.

12. The receiver of claim 11, wherein the decision feedback equalizer includes:
  a first summer configured to generate a first compensated data signal by summing the internal data signal and the first feedback signal:
  a first slicer configured to generate a first odd bit of the odd bits and a second even bit of the even bits by sampling the first compensated data signal based on the first strobe signal;
  a first latch configured to generate a third odd bit of the odd bits by latching an output of the first slicer based on the second strobe signal;
  a second latch configured to generate a fourth even bit of the even bits by latching the third odd bit based on the first strobe signal;
  a plurality of first multiplexers configured to provide the first summer with each of the even bits or the first logic level based on a respective one of the sub reset control signals;
  a second summer configured to generate a second compensated data signal by summing the internal data signal and the second feedback signal;
  a second slicer configured to generate a second odd bit of the odd bits and a first even bit of the even bits by sampling the second compensated data signal based on the second strobe signal;
  a third latch configured to generate a third even bit of the even bits by latching an output of the second slicer based on the first strobe signal;
  a fourth latch configured to generate a fourth odd bit of the odd bits by latching the third even bit based on the second strobe signal; and
  a plurality of second multiplexers configured to provide the second summer with each of the odd bits or the first logic level based on a respective one of the sub reset control signals.

13. The receiver of claim 11, wherein
the data strobe signal includes a first strobe signal and a second strobe signal that have a phase difference of 180 degrees with respect to each other, and
the decision feedback equalizer includes a divider configured to generate first through fourth divided strobe signals that have a phase difference of 90 degrees with respect to each other by dividing the first strobe signal and the second strobe signal.

14. The receiver of claim 13, wherein decision feedback equalizer is configured to:
  provide first through fourth feedback signals in a first operation mode in which the write operation is performed on the data signal by interleaving a plurality of bits of the sampled signal in parallel based on the first through fourth divided strobe signals and on a plurality of sub reset control signals of the reset control signal; and
  reset the first through fourth feedback signals with the first logic level in a second operation mode in which the write operation is not performed on the data signal.

15. The receiver of claim 14, wherein the decision feedback equalizer further includes:
  a first summer configured to generate a first compensated data signal by summing the internal data signal and the first feedback signal;
  a first slicer configured to generate a first bit of the sampled signal by sampling the first compensated data signal based on the first divided strobe signal;
  a second summer configured to generate a second compensated data signal by summing the internal data signal and the second feedback signal;
  a second slicer configured to generate a second bit of the sampled signal by sampling the second compensated data signal based on the second divided strobe signal;
  a third summer configured to generate a third compensated data signal by summing the internal data signal and the third feedback signal;
  a third slicer configured to generate a third bit of the sampled signal by sampling the third compensated data signal based on the third divided strobe signal;
  a fourth summer configured to generate a fourth compensated data signal by summing the internal data signal and the fourth feedback signal;
  a fourth slicer configured to generate a fourth bit of the sampled signal by sampling the fourth compensated data signal based on the fourth divided strobe signal; and
  first multiplexers, second multiplexers, third multiplexers, and fourth multiplexers configured to provide one of different a plurality of bits of the sampled data or the first logic level to the first summer, the second summer, the third summer, and the fourth summer, respectively, based on the sub reset control signals.

16. The receiver of claim 15, wherein the first multiplexers, the second multiplexers, the third multiplexers, and the fourth multiplexers are configured to select different one of the plurality of bits of the sampled signal at a same time point in the first operation mode based on the sub reset control signals.

17. A semiconductor memory device comprising:
a receiver connected to a memory controller through a channel, the receiver configured to generate an output data based on a data signal received from the channel; and
a control logic circuit configured to generate operating information associated with controlling the receiver based on a command received from the memory controller,
wherein the receiver comprises,
a buffer configured to generate an internal data signal by comparing the data signal with a reference voltage,
a decision feedback equalizer configured to generate a sampled signal based on a present value of the internal data signal and a feedback signal, and configured to provide the sampled signal or a first logic level as the feedback signal based on a reset control signal, the sampled signal corresponding to a previous value of the internal data signal,
a deserializer configured to generate the output data by deserializing the sampled signal, and
a reset control circuit configured to generate the reset control signal based on the operating information associated with a write operation of the data signal and configured to provide the reset control signal to the decision feedback equalizer.

18. The semiconductor memory device of claim 17, further comprising:
a memory cell array including a plurality of memory cells coupled to a plurality of word-lines and a plurality of bit-lines, the memory cell array configured to store the output data,
wherein in response to the reset control signal, the decision feedback equalizer is configured to,
update the feedback signal with the sampled signal in a first operation mode in which the write operation is performed on the data signal, and
reset the feedback signal with the first logic level in a second operation mode in which the write operation is not performed on the data signal.

19. The semiconductor memory device of claim 18, wherein
the data signal includes a multi-level signal having one of three or more voltage levels different from each other, and
the decision feedback equalizer is configured to reset a corresponding feedback signal with the first logic level with respect to each of the three or more voltage levels in the second operation mode.

20. A receiver comprising:
a buffer configured to generate an internal data signal by comparing a received data signal with a reference voltage;
a decision feedback equalizer configured to generate a sampled signal based on a present value of the internal data signal and on a feedback signal, and configured to provide the sampled signal or a first logic level as the feedback signal based on a reset control signal, the sampled signal corresponding to a previous value of the internal data signal;
a deserializer configured to generate an output data by deserializing the sampled signal; and
a reset control circuit configured to generate the reset control signal based on operation information associated with a write operation of the data signal and configured to provide the reset control signal to the decision feedback equalizer,
wherein the decision feedback equalizer includes,
a summer configured to generate a compensated data signal by summing the internal data signal and the feedback signal,
a slicer configured to output the sampled signal by sampling the compensated data signal based on a data strobe signal, and
a selection circuit configured to operate based on the reset control signal to update the feedback signal with the sampled signal in a first operation mode in which the write operation is performed on the data signal and configured to reset the feedback signal with the first logic level in a second operation mode in which the write operation is not performed on the data signal.

* * * * *